(12) United States Patent
Kim

(10) Patent No.: US 11,956,912 B2
(45) Date of Patent: Apr. 9, 2024

(54) FOLDABLE DEVICE

(71) Applicant: Samsung Electronics Co., Ltd., Suwon-si (KR)

(72) Inventor: Yongyoun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/991,210

(22) Filed: Nov. 21, 2022

(65) Prior Publication Data

US 2023/0081207 A1     Mar. 16, 2023

Related U.S. Application Data

(63) Continuation of application No. 16/796,361, filed on Feb. 20, 2020, now Pat. No. 11,510,328.

(30) Foreign Application Priority Data

Feb. 20, 2019   (KR) ........................ 10-2019-0020117

(51) Int. Cl.
    *H05K 5/02*            (2006.01)
    *G06F 1/16*            (2006.01)
    (Continued)

(52) U.S. Cl.
    CPC ......... *H05K 5/0247* (2013.01); *G06F 1/1616* (2013.01); *H04B 1/40* (2013.01);
    (Continued)

(58) Field of Classification Search
    CPC .. H05K 5/0017; H05K 5/0086; H05K 5/0226; H05K 5/0247; H05K 1/147;
    (Continued)

(56) References Cited

U.S. PATENT DOCUMENTS 7,889,139 B2    2/2011   Hobson et al.
8,787,016 B2    7/2014   Rothkopf et al.
(Continued)

FOREIGN PATENT DOCUMENTS

CN      102110873 A     6/2011
CN      102761810 A    10/2012
(Continued)

OTHER PUBLICATIONS

International Search Report and Written Opinion dated Jun. 19, 2020, issued in International Patent Application No. PCT/KR2020/002455.

(Continued)

*Primary Examiner* — Roshn K Varghese
(74) *Attorney, Agent, or Firm* — Jefferson IP Law, LLP

(57) ABSTRACT

An electronic device is provided. The electronic device includes a foldable housing configured to include a hinge structure, a first housing structure that has a first face that is connected to the hinge structure and is directed in a first direction, a second face that is directed in a second direction opposite to the first direction, and a first lateral member that at least partly surrounds a space between the first face and the second face, and a second housing structure that has a third face that is connected to the hinge structure and is directed in a third direction, a fourth face that is directed in a fourth direction opposite to the third direction, a second lateral member that at least partly surrounds a space between the third face and the fourth face, and that is folded about the hinge structure onto the first housing structure, a flexible display, a first magnet a second magnet and at least one electrical path.

10 Claims, 17 Drawing Sheets

(51) Int. Cl.
  *H04B 1/40* (2015.01)
  *H04M 1/02* (2006.01)
  *H05K 1/14* (2006.01)
  *H05K 1/18* (2006.01)
  *H05K 5/00* (2006.01)

(52) U.S. Cl.
  CPC .......... *H04M 1/0268* (2013.01); *H05K 1/147* (2013.01); *H05K 5/0017* (2013.01); *H05K 5/0086* (2013.01); *H05K 5/0226* (2013.01); *H05K 1/189* (2013.01)

(58) Field of Classification Search
  CPC ..... H05K 1/189; G06F 1/1616; G06F 1/1615; G06F 1/1652; G06F 1/1679; G06F 1/1681; G06F 1/1641; G06F 1/1635; G06F 3/041; H04B 1/40; H04M 1/0266; H04M 1/0216; H04M 1/0214; H04M 1/0249; H04M 1/026; H04M 1/0262; H04M 1/0264; H04M 1/0277; H04M 1/035; H04M 1/0268; G09F 9/301; H01R 13/6205
  See application file for complete search history.

(56) References Cited

U.S. PATENT DOCUMENTS

| | | |
|---|---|---|
| 9,176,535 B2 | 11/2015 | Bohn et al. |
| 9,363,904 B1 | 6/2016 | Szeto |
| 9,467,548 B1 | 10/2016 | Allore et al. |
| 9,504,170 B2 | 11/2016 | Rothkopf et al. |
| 9,848,502 B1 | 12/2017 | Chu et al. |
| 9,992,888 B2 | 6/2018 | Moon et al. |
| 10,075,569 B2 | 9/2018 | Kim et al. |
| 10,539,981 B2 | 1/2020 | Lin et al. |
| 2008/0174127 A1 | 7/2008 | Kim et al. |
| 2017/0005557 A1 | 1/2017 | Wieters |
| 2017/0013729 A1 | 1/2017 | Rothkopf et al. |
| 2017/0336834 A1 | 11/2017 | Senatori et al. |
| 2018/0292859 A1 | 10/2018 | Aurongzeb et al. |
| 2018/0324964 A1 | 11/2018 | Yoo et al. |
| 2018/0341290 A1 | 11/2018 | Sim et al. |
| 2018/0364761 A1 | 12/2018 | Lin et al. |
| 2018/0366813 A1 | 12/2018 | Kim et al. |
| 2018/0375976 A1 | 12/2018 | Kikuchi |
| 2019/0036068 A1 | 1/2019 | Kim et al. |
| 2020/0019215 A1 | 1/2020 | Wang |

FOREIGN PATENT DOCUMENTS

| | | |
|---|---|---|
| CN | 203800977 U | 8/2014 |
| CN | 106063098 A | 10/2016 |
| CN | 106486020 A | 3/2017 |
| CN | 106711579 A | 5/2017 |
| CN | 108292796 A | 7/2018 |
| CN | 208401905 U | 1/2019 |
| EP | 3 439 103 A1 | 2/2019 |
| KR | 20-0428786 Y1 | 10/2006 |
| KR | 10-2014-0046346 A | 4/2014 |
| KR | 10-2016-0083318 A | 7/2016 |
| KR | 10-2017-0066944 A | 6/2017 |
| KR | 10-2018-0029590 A | 3/2018 |
| KR | 10-2018-0131143 A | 12/2018 |
| RU | 2 596 469 C2 | 9/2016 |
| WO | 2017/114460 A1 | 7/2017 |

OTHER PUBLICATIONS

Extended European Search Report dated Jun. 19, 2020, issued in European Patent Application No. 20158541.1-1216.

European Search Report dated Jan. 26, 2021, issued in European Application No. 20158541.1.

Extended European Search Report dated Nov. 11, 2021, issued in European Patent Application No. 21189856.4 1216.

Chinese Office Action dated Jan. 12, 2022, issued in Chinese Patent Application No. 202010104286.3.

Russian Office Action with English translation dated May 31, 2022; Russian Appln. No. 2021127228/28(057381).

Russian Office Action with English translation dated Sep. 12, 2022; Russian Appln. No. 2021127228/28(057381).

Extended European Search Report dated Jan. 16, 2023, issued in European Patent Application No. 22201933.3.

Russian Decision on Grant dated Mar. 6, 2023, issued in Russian Patent Application No. 2022123157.

Indonesian Office Action with English translation dated Jun. 21, 2023; Indonesian Appln. No. P00202107361.

Indian Office Action dated Apr. 12, 2023; Indian Appln. No. 202117041061.

Korean Office Action dated Dec. 21, 2023, issued in Korean Application No. 10-2019-0020117.

FOLDABLE DEVICE

CROSS-REFERENCE TO RELATED APPLICATION(S)

This application is a continuation application of prior application Ser. No. 16/796,361, filed on Feb. 20, 2020, which is based on and claims priority under 35 U.S.C. § 119(a) of a Korean patent application number 10-2019-0020117, filed on Feb. 20, 2019, in the Korean Intellectual Property Office, the disclosure of which is incorporated by reference herein in its entirety.

BACKGROUND

1. Field

The disclosure relates to a foldable device.

2. Description of Related Art

With the development of electronic communication technologies, electronic devices having various functions have appeared. These electronic devices can generally perform one or more functions.

As a functional difference among the electronic devices of manufacturing companies has been remarkably reduced in recent years, the electronic devices are strengthened in the design aspect and are gradually made slim in order to satisfy the desire of consumers.

The above information is presented as background information only to assist with an understanding of the disclosure. No determination has been made, and no assertion is made, as to whether any of the above might be applicable as prior art with regard to the disclosure.

SUMMARY

Such an electronic device may be realized in a foldable type having a flexible display. The foldable type electronic device may be disposed in a folded state by superimposing at least two housings on each other. The housings may be formed to be thin such that the electronic device can be made slim in the folded state. A reduction in the thicknesses of each housing makes an internal space small, which can make it difficult to dispose components in the housing. The electronic device may include magnets for maintaining the folded state against an elastic force of the flexible display. The magnet occupies a part of the internal space of the housing, which can make it more difficult to dispose the other components. For example, if the internal space of the housing is reduced, an electrical path (e.g., a transmission line) relevant to an antenna device, or electrical paths relevant to various other components other than the antenna device cannot be easily disposed in the small internal space in the housing while avoiding an electrical influence from peripheral components.

Aspects of the disclosure are to address at least the above-mentioned problems and/or disadvantages and to provide at least the advantages described below. Accordingly, an aspect of the disclosure is to provide an electronic device that includes magnets for efficiently disposing components in a confined internal space of each housing.

Additional aspects will be set forth in part in the description which follows and, in part, will be apparent from the description, or may be learned by practice of the presented embodiments.

In accordance with an aspect of the disclosure, an electronic device is provided. The electronic device includes a foldable housing configured to include a hinge structure, a first housing structure that has a first face that is connected to the hinge structure and is directed in a first direction, a second face that is directed in a second direction opposite to the first direction, and a first lateral member that at least partly surrounds a space between the first face and the second face, and a second housing structure that has a third face that is connected to the hinge structure and is directed in a third direction, a fourth face that is directed in a fourth direction opposite to the third direction, a second lateral member that at least partly surrounds a space between the third face and the fourth face, and that is folded about the hinge structure onto the first housing structure, the first lateral member provides a first lateral face and a second lateral face that are directed opposite to each other, and a third lateral face that is orthogonal to the first lateral face and is disposed apart from the hinge structure, the second lateral member provides a fourth lateral face that is directed in the same direction as the first lateral face, a fifth lateral face that is directed in the same direction as the second lateral face, and a sixth lateral face that is directed in the same direction as the third lateral face in the folded state, and the first face faces the third face in a folded state, and the third direction is the same as the first direction in an unfolded state, a flexible display configured to extend from the first face to the third face, a first magnet disposed around the third lateral face in the first housing structure, a second magnet having polarities different from those of the first magnet and disposed around the sixth lateral face in the second housing structure so as to face the first magnet in the folded state, and at least one electrical path disposed in a recess formed in the first magnet.

According to various embodiments of the disclosure, an electrical path for an antenna device or various other elements can raise spatial efficiency and be disposed in a confined internal space of a housing along with a magnet.

In addition, effects that can be obtained or predicted due to various embodiment of the disclosure will be directly or implicitly disclosed in the detailed description of the embodiments of the disclosure. For example, various effects predicted according to various embodiment of the disclosure will be disclosed in the detailed description to be described below.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
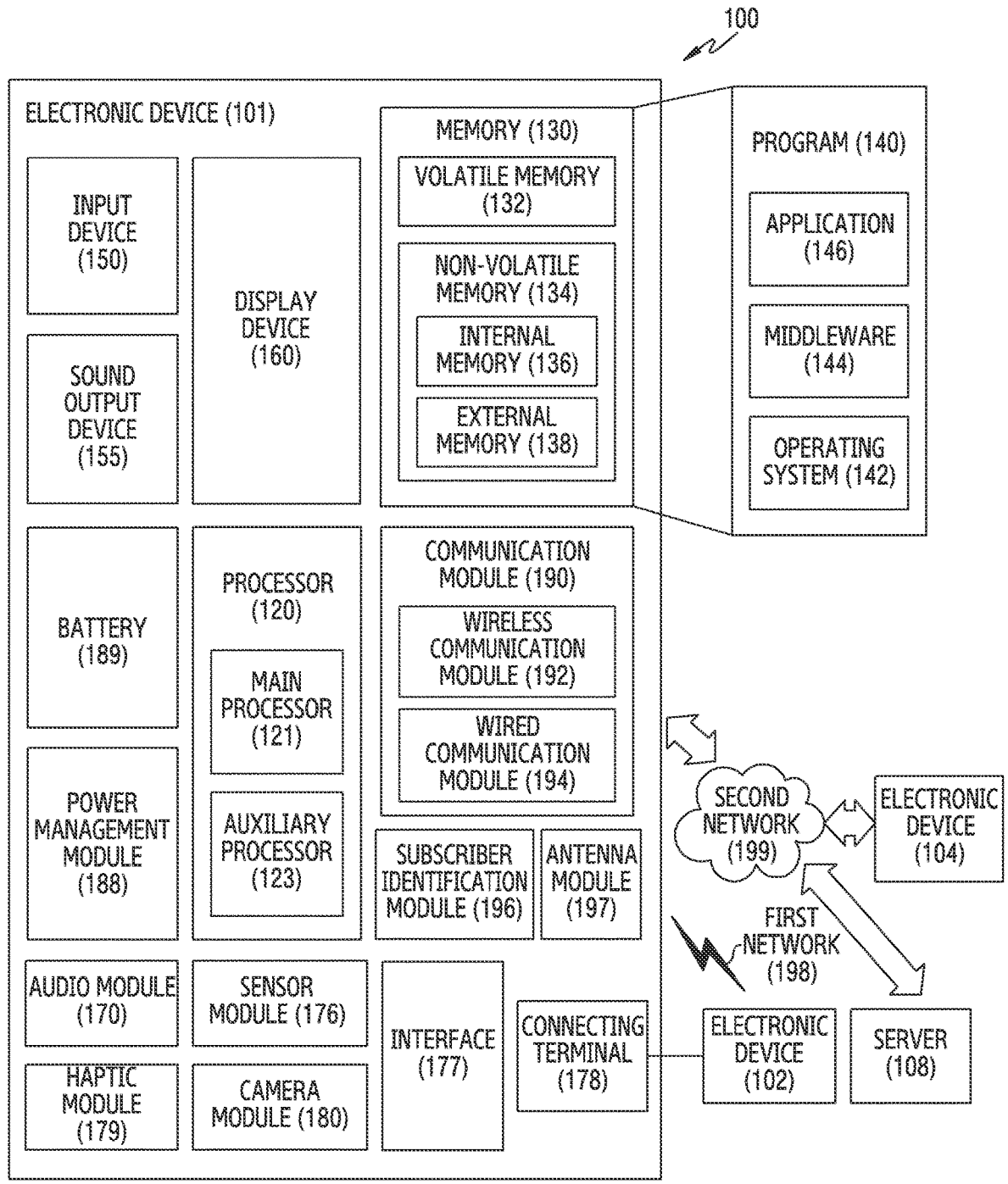
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
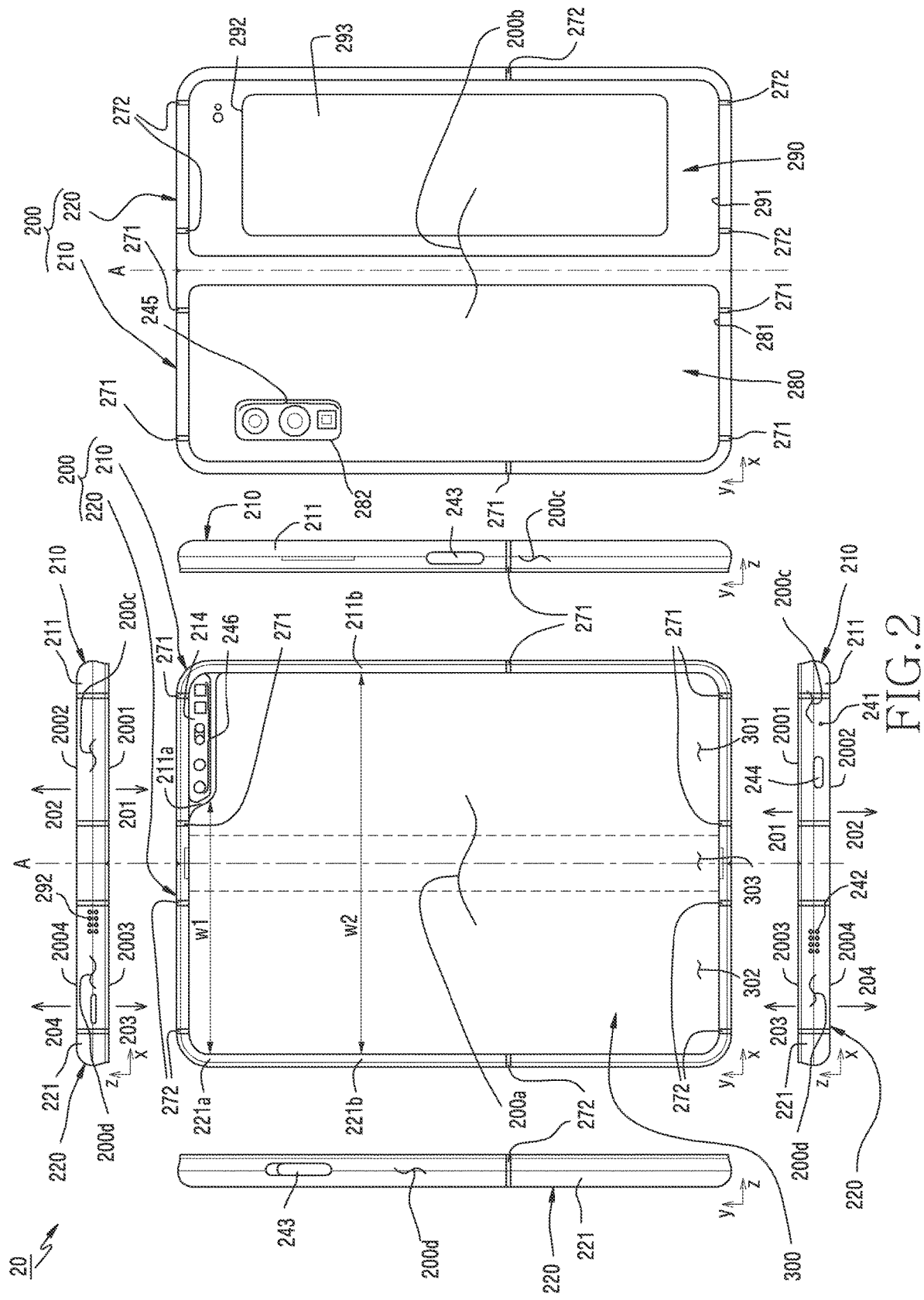
FIG. 2 is a view illustrating an unfolded state of an electronic device according to an embodiment of the disclosure.

FIG. 2 is a view illustrating a flat or unfolded state of an electronic device according to an embodiment of the disclosure.

Figure 3:
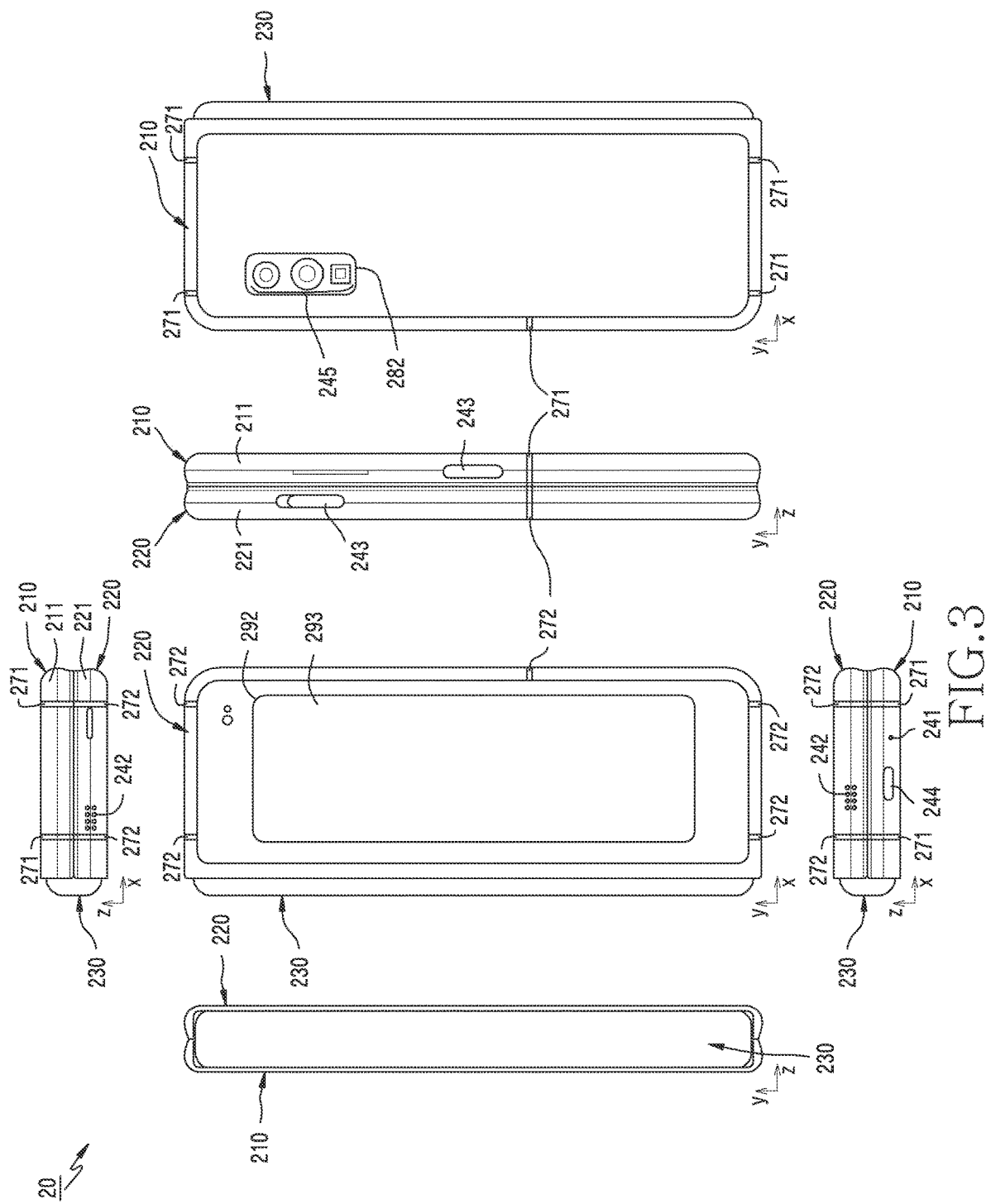
FIG. 3 is a view illustrating a folded state of an electronic device according to an embodiment of the disclosure.

FIG. 3 is a view illustrating a folded state of an electronic device according to an embodiment of the disclosure.

Referring to FIGS. 2 and 3, in one embodiment, an electronic device 20 (e.g., the electronic device 101 of FIG. 1) may include a foldable housing 200, a hinge cover 230 that covers a foldable portion of the foldable housing 200, and a flexible or foldable display 300 (hereinafter abbreviated to a display 300) (e.g., the display device 160 of FIG. 1) that is disposed in a space defined by the foldable housing 200. According to one embodiment, foldable housing 200 may include a front face 200a to which the display 300 is exposed, a rear face 200b that is directed toward a side opposite to the front face 200a, and lateral faces 200c and 200d that surround a space between the front face 200a and the rear face 200b.

According to one embodiment, the foldable housing 200 may include a first housing structure 210 and a second housing structure 220 that are joined by a hinge structure (not illustrated). For example, the first housing structure 210 may be rotatably joined with the second housing structure 220 by the hinge structure.

According to one embodiment, the first housing structure 210 may include a first face 2001 that is directed in a first direction 201, a second face 2002 that is directed in a second direction 202 opposite to the first direction 201, and a first lateral face 200c that at least partly surrounds a space between the first face 2001 and the second face 2002. The second housing structure 220 may include a third face 2003 that is directed in a third direction 203, a fourth face 2004 that is directed in a fourth direction 204 opposite to the third face 2003, and a second lateral face 200d that at least partly surrounds a space between the third face 2003 and the fourth face 2004. The front face 200a of the electronic device 20 may include the first face 2001 and the third face 2003, and the rear face 200b of the electronic device 20 may include the second face 2002 and the fourth face 2004. In various embodiments (not illustrated), the first housing structure 210 may refer to a structure in which some of the first face 2001, the second face 2002, and the first lateral face 200c are formed. In various embodiments (not illustrated), the second housing structure 220 may refer to a structure in which some of the third face 2003, the fourth face 2004, and the second lateral face 200d are formed.

According to one embodiment, the foldable housing 200 may include a transparent plate (not illustrated) (e.g., a polymer plate including various coating layers) of which the first face 2001 and the third face 2003 are formed. The display 300 may be disposed along the transparent plate, and be exposed through the first face 2001 and the third face 2003. The transparent plate may have flexibility by which a folded state of the electronic device 20 is made possible. According to one embodiment, the display 300 may be realized to include the transparent plate, and the transparent plate may be omitted from the foldable housing 200.

According to one embodiment, the first housing structure 210 may include a first rear cover 280 that is disposed on one side of a folding axis A and forms at least a part of the second face 2002. For example, the first rear cover 280 may have a substantially rectangular periphery 281, and the periphery 281 may be surrounded by a first lateral member 211. According to various embodiments, the first lateral member 211 and the first rear cover 280 may be integrally formed, and may include the same material.

According to one embodiment, the second housing structure 220 may include a second rear cover 290 that is disposed on the other side of the folding axis A and forms at least a part of the fourth face 2004. For example, the second rear cover 290 may have a substantially rectangular periphery 291, and the periphery 291 may be surrounded by a second lateral member 221. According to various embodiments, the second lateral member 221 and the second rear cover 290 may be integrally formed, and may include the same material.

According to various embodiments, the first rear cover 280 and/or the second rear cover 290 may be formed of, for instance, a coated or colored glass, a ceramic, a polymer, a metal (e.g., aluminum, stainless steel (STS), or magnesium), or a combination of at least two thereof.

According to one embodiment, the first rear cover 280 and the second rear cover 290 may be substantially symmetrical in shape with respect to the folding axis A. The first rear cover 280 and the second rear cover 290 are not necessarily symmetrical in shape with each other. In another embodiment, the first rear cover 280 and/or the second rear cover 290 having various different shapes may be provided.

According to one embodiment, the first housing structure 210 may include the first lateral member (or a first lateral bezel structure) 211 that forms the first lateral face 200c, and the second housing structure 220 may include the second lateral member (or a second lateral bezel structure) 221 that forms the second lateral face 200d. The first lateral member 211 and/or the second lateral member 221 may include a metal or a polymer.

According to various embodiments, the first lateral member 211 and the second lateral member 221 may extend to form a periphery region of the front face 200a. For example, the front face 200a of the electronic device 20 may be formed by the display 300, and partial regions of the first and second lateral members 211 and 221 that adjoin the display 300.

According to various embodiments, a partial region (not illustrated) of the first lateral member 211 which adjoins the periphery 281 of the first rear cover 280 and/or a partial region (not illustrated) of the second lateral member 221 which adjoins the periphery 291 of the second rear cover 290 may form a part of the rear face 200b. For example, the rear face 200b of the electronic device 20 may be formed by the first rear cover 280, a partial region of the first lateral member 211 which adjoins the first rear cover 280, the second rear cover 290, and a partial region of the second lateral member 221 which adjoins the second rear cover 290).

According to one embodiment, the first lateral member 211 and the second lateral member 221 may be disposed on both sides with respect to the folding axis A, and may be symmetrical in shape with respect to the folding axis A on the whole.

According to one embodiment, the first housing structure 210 may further include a component layout region 214 that extends from the first lateral member 211 or is coupled with the first lateral member 211, and forms the first face 2001 along with the display 300. A region of the first lateral member 211 other than the component layout region 214 may be symmetrical in shape with the second lateral member 221. At least one part making good use of the first face 2001 may be disposed in the component layout region 214. According to one embodiment, the component layout region 214 may be formed to have a region set adjacent to one corner of the first lateral member 211. According to various embodiments, a layout, shape, and size of the component layout region 214 are not limited to the illustrated example. For example, in another embodiment, the component layout region 214 may be included in another corner of the first lateral member 211 or in an arbitrary region between upper and lower end corners of the first lateral member 211. Components for performing various functions mounted in the electronic device 20 can be exposed to the first face 2001 through the component layout region 214 or through one or more openings (not illustrated) provided in the component layout region 214. According to one embodiment, the component 246 disposed in the component layout region 214 may include at least one of various sensors such as a proximity sensor, a front camera, a light-emitting element, or a receiver. For example, the light-emitting element may provide information about a state of the electronic device 20 in a form of light. In another embodiment, the light-emitting element may provide, for instance, a light source that is interlinked with an operation of the front camera. The light-emitting element may include, for instance, an LED, an IR LED, and a xenon lamp.

According to one embodiment, the electronic device 20 may include at least one of audio modules 241 and 242, key input devices 243, or a connector hole 244.

According to one embodiment, the audio modules 241 and 242 may include a microphone hole 241 or a speaker hole 242. A microphone for obtaining external sounds may be disposed in the microphone hole 241. In any embodiment, a plurality of microphones may be disposed in the microphone hole 241 to be able to sense directions of the sounds. The speaker hole 242 may include an external speaker hole or a receiver hole for communication. In any embodiment, the speaker hole 242 and the microphone hole 241 may be realized as one hole, or a speaker (e.g., a piezo speaker) may be included without the speaker hole 242.

According to one embodiment, the key input devices 243 may be disposed on the lateral faces 200c and 200d of the foldable housing 200. In another embodiment, the electronic device 20 may not include some or all of the aforementioned key input devices 243, and the key input devices 243 that are not included may be realized on the display 300 in another form such as soft keys. In any embodiment, the key input device may include a sensor module (e.g., one or more components 245 disposed in a first rear region 282) that is disposed on the second face 2002 of the first housing structure 210.

According to one embodiment, the connector hole 244 may include a first connector hole that can house a connector (e.g., a USB connector) for transmitting/receiving power and/or data to/from an external electronic device, and/or a second connector hole (e.g., an earphone jack) that can house a connector for transmitting/receiving an audio signal to/from an external electronic device. Positions or number of the connector holes are not limited to the example illustrated in FIG. 3, and may be changed.

In another example (not illustrated), at least one of an audio module (e.g., a receiver for communication), a sensor module (e.g., a proximity sensor or a fingerprint sensor), a camera module (e.g., a front camera), or a light-emitting element may be included on the back of a screen display region of the display 300. In another example (not illustrated), the display 300 may be joined with or disposed adjacent to a touch sensor circuit, a pressure sensor capable of measuring an intensity (a pressure) of a touch, and/or a digitizer that detects a stylus pen based on a magnetic field.

In one embodiment, the first housing structure 210 and the second housing structure 220 may form a recess that is a space in which the display 300 is disposed together. In the illustrated embodiment, due to the component layout region 214, the recess may have two or more widths different from each other in a direction perpendicular to the folding axis A.

For example, the recess may include a first width w1 between a first portion 221a of the second lateral member 221 which is parallel to the folding axis A and a first portion 211a of the first lateral member 211 which is formed at the periphery of the component layout region 214. The recess may include a second width w2 between a second portion 221b of the second lateral member 221 and a second portion 211b of the first lateral member 211 which does not correspond to the component layout region 214 and is parallel to the folding axis A. The second width w2 may be formed to be longer than the first width w1. According to one embodiment, the first portion 211a of the first housing structure 210 and the first portion 221a of the second housing structure 220, both of which are asymmetrical in shape with each other, may form the first width w1 of the recess, and the second portion 211b of the first housing structure 210 and the second portion 221b of the second housing structure 220, both of which are symmetrical in shape with each other, may form the second width w2 of the recess. According to one embodiment, the first and second portions 221a and 221b of the second housing structure 220 may be different in distance from the folding axis A from each other. The widths of the recess are not limited to the illustrated example. According to various embodiments, the recess may have a plurality of widths depending on a shape of the component layout region 214 or asymmetrical portions of the first and second housing structures 210 and 220.

According to various embodiments, one or more components may be disposed on or visually exposed to the rear face 200b of the electronic device 20. For example, at least a part of the sub-display 293 may be visually exposed through the second rear region 292 of the second rear cover 290. For example, the one or more components 245 may be visually exposed through the first rear region 282 of the first rear cover 280. In various embodiments, the one or more components 245 may include a sensor (e.g., a proximity sensor or a heart rate sensor) and/or a rear camera.

Referring to FIG. 3, the hinge cover 230 may be disposed between the first housing structure 210 and the second housing structure 220, and may cover an internal component (e.g., a hinge structure). According to any embodiment, the hinge structure may be referred to as an element that includes the hinge cover 230. In one embodiment, according to a state (e.g., an unfolded state or a folded state) of the electronic device 20, the hinge cover 230 may be covered by parts of the first and second housing structures 210 and 220, or be exposed to the outside.

For example, as illustrated in FIG. 2, in a case where the electronic device 20 is in an unfolded state, the hinge cover 230 may be covered by the first housing structure 210 and the second housing structure 220, and may not be exposed. For example, as illustrated in FIG. 3, in a case where the electronic device 20 is in a folded state (e.g., a fully folded state), the hinge cover 230 may be exposed to outside between the first housing structure 210 and the second housing structure 220. For example, in a case where the electronic device 20 is in an intermediate state (e.g., a state between the unfolded state and the folded state) in which the first housing structure 210 and the second housing structure 220 are folded with a prescribed angle, the hinge cover 230 may be partly exposed to the outside between the first housing structure 210 and the second housing structure 220. A region in which the hinge cover 230 is exposed in the intermediate state may be smaller than a region in which the hinge cover 230 is exposed in the fully folded state. In one embodiment, the hinge cover 230 may include a curved surface, and the curved surface may form one lateral face of the electronic device 20 in the folded state.

According to various embodiments, the display 300 may be a display, at least partial region of which may be deformed into a flat or curved surface. In one embodiment, referring to FIG. 2, the display 300 may include a folding region 303, a first region 301 disposed on one side of the folding region 303 (the right side of the folding region 303), and a second region 302 disposed on the other side of the folding region 303 (the left side of the folding region 303).

According to various embodiments, the region division of the display 300 illustrated in FIG. 2 is given by way of example, and the display 300 may be divided into a plurality of regions (e.g., four or more regions or two regions) according to a structure or a function. For example, in the embodiment illustrated in FIG. 2, the region of the display 300 may be divided into the folding region 303 extending to be parallel to the y axis or the folding axis A. However, in another embodiment, the region of the display 300 may be divided on the basis of another folding region (e.g., a folding region parallel to the x axis) or another folding axis (e.g., a folding axis parallel to the x axis).

According to one embodiment, the first and second regions 301 and 302 of the display 300 may be symmetrical in shape with respect to the folding region 303 on the whole. According to one embodiment, unlike the first region 301, the second region 302 may include a cut notch due to the presence of the component layout region 214, but may be symmetrical in shape with the first region 301 with respect to the folding region 303 in a region other than the cut notch. For example, the first region 301 and the second region 302 may include portions that are symmetrical in shape with respect to the folding region 303, and portions that are asymmetrical in shape with respect to the folding region 303.

According to one embodiment, an angle and distance formed by the first housing structure 210 and the second housing structure 220 may vary according to an unfolded state, a folded state, or an intermediate state of the foldable housing 200. Hereinafter, operations of the first and second housing structures 210 and 220 and regions of the display 300 according to the state (e.g., the unfolded state or the folded state) of the electronic device 20 will be described.

According to one embodiment, in the case where the electronic device 20 are in the unfolded state (e.g., see FIG. 2), the first direction 201 in which the first face 2001 of the first housing structure 210 is directed and the third direction 203 in which the third face 2003 of the second housing structure 220 is directed may be the same. For example, in the unfolded state, the first face 2001 of the first housing structure 210 and the third face 2003 of the second housing structure 220 may be disposed to have the same direction (e.g., the direction in which the front face 200a of the electronic device 20 is directed) at an angle of about 180 degrees. In the state in which the electronic device 20 are in the unfolded state, surfaces of the first and second regions 301 and 302 of the display 300 may be directed in the same direction (e.g., the direction in which the front face 200a of the electronic device 20 is directed) at an angle of about 180 degrees. The folding region 303 of the display 300 may form the same plane as the first region 301 and the second region 302.

In one embodiment, in the case where the electronic device 20 are in the folded state (e.g., see FIG. 3), the first housing structure 210 and the second housing structure 220 may be disposed to face each other. For example, in the folded state, the first face 2001 of the first housing structure 210 and the third face 2003 of the second housing structure 220 may face each other. In the folded state, the surfaces of the first and second regions 301 and 302 of the display 300 may face each other at a small angle (e.g., an angle between about 0 to 10 degrees). In the folded state, at least a part of the folding region 303 may have a curved surface of a specified curvature.

In one embodiment, in the case where the electronic device 20 is in the intermediate state (e.g., the state between the unfolded state and the folded state), the first housing structure 210 and the second housing structure 220 may be disposed at a certain angle. In the intermediate state, the first face 2001 of the first housing structure 210 and the third face 2003 of the second housing structure 220 or the surfaces of the first and second regions 301 and 302 of the display 300 may be formed at an angle that is greater than in the folded state and is smaller than in the unfolded state. In the intermediate state, at least a part of the folding region 303 may have a curved surface of a specified curvature, wherein the curvature may be smaller than in the folded state.

According to one embodiment, the first lateral member 211 may include a plurality of first conductive parts (not illustrated) that are separated physically or electrically. First non-conductive members 271 may be each disposed between the plurality of first conductive parts. According to one embodiment, the first non-conductive members 271 may extend from first non-conductive internal structures (not illustrated) disposed inside the first housing structure 210. The first internal structures (not illustrated) may be joined with the first lateral member 211, and thereby the plurality of first conductive parts may be maintained in a physically separated state by the first internal structures. For example, the first internal structures may be formed by insert injection in a form joined with the first lateral member 211.

According to one embodiment, the second lateral member 221 may include a plurality of second conductive parts (not illustrated) that are separated physically or electrically. Second non-conductive members 272 may be each disposed between the plurality of second conductive parts. According to one embodiment, the second non-conductive members 272 may extend from second non-conductive internal structures (not illustrated) disposed inside the second housing structure 220. The second internal structures may be joined with the second lateral member 221, and thereby the plurality of second conductive parts may be maintained in a physically separated state by the second internal structures. For example, second internal structures may be formed by insert injection in a form joined with the second lateral member 221.

According to one embodiment, at least one of the plurality of first conductive parts of the first lateral member 211 may be utilized as an antenna radiator (or a radiator or an antenna) that is electrically connected to a wireless communication circuit (e.g., the wireless communication module 192 of FIG. 1) and can transmit or receive a signal having a selected (or specified) frequency. For example, at least one of the first conductive parts may be electrically connected to the wireless communication circuit and the ground, and be operated as an inverted F antenna (IFA). According to any embodiment, at least one of the plurality of second conductive parts of the second lateral member 221 may be electrically connected to a wireless communication circuit, and be utilized as an antenna radiator.

Referring to FIG. 3, when the electronic device 20 is in the folded state, the second lateral member 221 and the first lateral member 211 may be adjacent to each other, and the wireless communication circuit in which at least one of the first conductive parts is utilized as the antenna radiator may be electrically influenced by the second lateral member 221. For example, in the folded state, the second lateral member 221 may deteriorate performance (e.g., antenna radiation performance) of the wireless communication circuit in which at least one of the first conductive parts is utilized as the antenna radiator. For example, an electromagnetic wave energy (or an electromagnetic field) discharged from at least one of the first conductive parts which is utilized as the antenna radiator may be obstructed by the second lateral member 221. According to one embodiment, to reduce this electric influence, the first non-conductive members 271 of the first lateral member 211 and the second non-conductive members 272 of the second lateral member 221 may be designed to be substantially aligned to each other in the folded state.

Referring to FIG. 3, the first non-conductive members 271 of the first lateral member 211 and the second non-conductive members 272 of the second lateral member 221 may be substantially aligned to each other in the folded state, so that the antenna radiation performance can be improved, but the antenna radiation performance may be difficult to be secured above a set value due to electromagnetic coupling between the first and second conductive parts adjacent to each other. For example, due to an electric field discharged from the first conductive parts utilized as the antenna radiator in the folded state, parasitic resonance (or a parasitic component) may be formed at the second conductive parts, and may deteriorate the antenna radiation performance of the first conductive part in the wireless communication circuit in which at least one of the first conductive parts is utilized as the antenna radiator. For example, in the folded state, capacitance may be formed between the first conductive part and the second conductive part due to the electromagnetic coupling, and the electromagnetic wave energy (or the electromagnetic field) discharged from the first conductive part utilized as the antenna radiator may be induced to the second conductive parts. Due to the induced electromagnetic wave energy, a reverse current may be formed at the second conductive parts unlike a forward direction flowing at the first conductive parts, and thus the antenna radiation performance of the first conductive part in the wireless communication circuit in which at least one of the first conductive parts is utilized as the antenna radiator may be deteriorated. According to one embodiment, the electronic device 20 may include a frequency control circuit for preventing the antenna radiation performance of the at least one first conductive part from being deteriorated in the folded state by the second lateral member 221. In the frequency control circuit, an electric element such as an element having inductance, capacitance or conductance may be included in a transmission line for the antenna radiator (e.g., the at least one first conductive part).

According to various embodiments, the hinge structure (e.g., the hinge cover 230) may include at least one of third conductive parts. The at least one of third conductive part of the hinge structure may be electrically connected to the wireless communication circuit (e.g., the wireless communication module 192 of FIG. 1), and be utilized as an antenna radiator.

Figure 4:
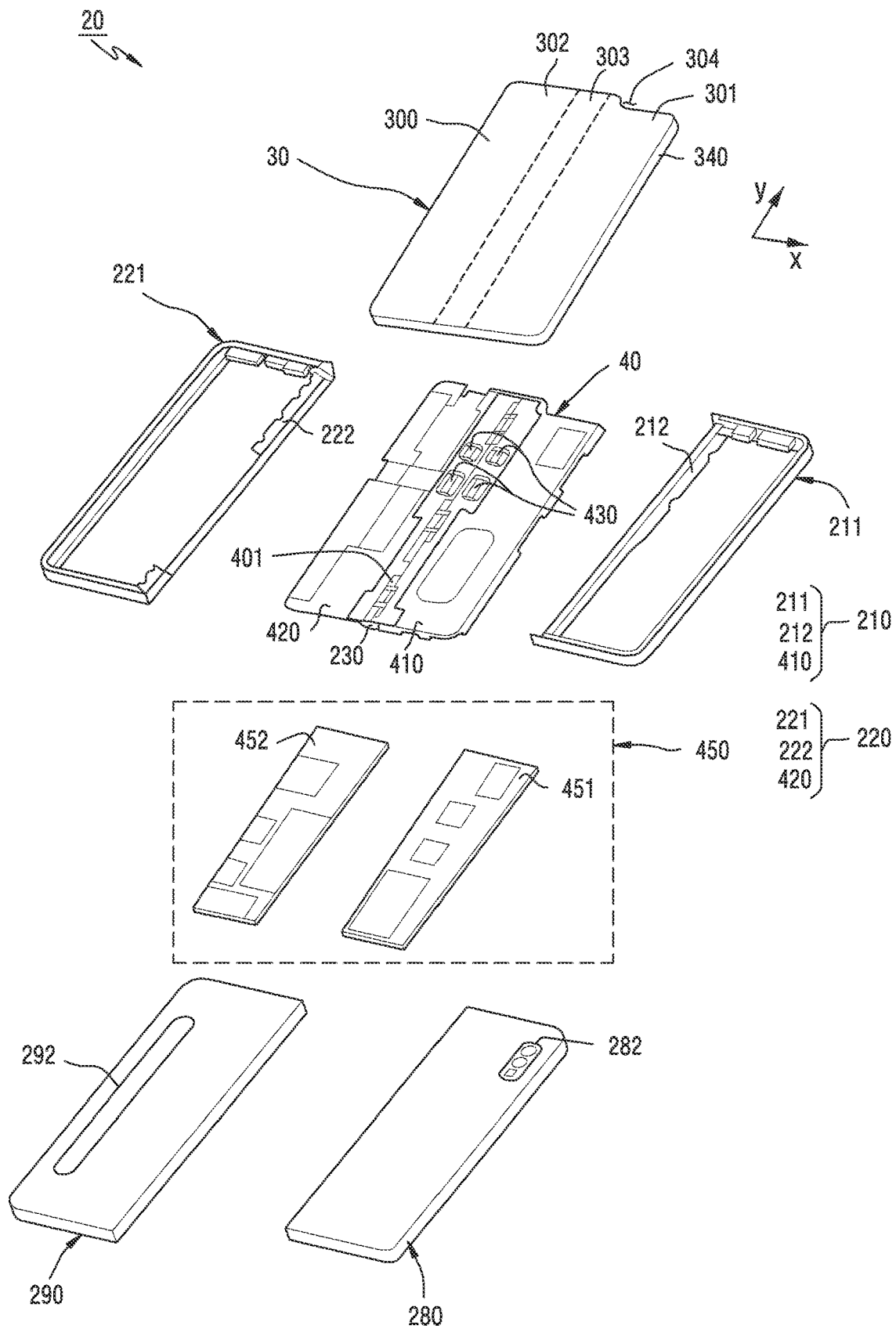
FIG. 4 is an exploded perspective view of an electronic device of FIG. 2 or 3 according to an embodiment of the disclosure.

FIG. 4 is an exploded perspective view of an electronic device of FIG. 2 or 3 according to an embodiment of the disclosure.

Referring to FIG. 4, in one embodiment, an electronic device 20 may include at least one of a display part 30, a support member assembly 40, a board part 450, the first lateral member 211, the second lateral member 221, the first rear cover 280 or the second rear cover 290. The display part 30 used herein may refer to a display module or a display assembly.

The display part 30 may include, for instance, a display 300, and one or more plates or layers 340 on which the display 300 is seated. In one embodiment, the plate 340 may be disposed between the display 300 and the support member assembly 40. The display 300 may be disposed on at least a part of one surface (e.g., an upper surface based on FIG. 4) of the plate 340. The plate 340 may be formed in a shape corresponding to the display 300. For example, a partial region of the plate 340 may be formed in a shape corresponding to a notch 304 of the display 300.

According to one embodiment, the support member assembly 40 may include a first support member 410, a second support member 420, a hinge structure 401 that is disposed between the first support member 410 and the second support member 420, the hinge cover 230 that covers the hinge structure 401 when viewed from the outside, and wiring members 430 (e.g., flexible printed circuits (FPCs)) that cross the first support member 410 and the second support member 420.

In one embodiment, the support member assembly 40 may be disposed between the plate 340 and the board part 450. For example, the first support member 410 may be disposed between the first region 301 of the display 300 and a first board 451 (e.g., a first printed circuit board (PCB)). The second support member 420 may be disposed between the second region 302 of the display 300 and a second board 452 (e.g., a second PCB).

According to one embodiment, the wiring members 430 and at least a part of the hinge structure 401 may be disposed inside the support member assembly 40. The wiring members 430 may be disposed in a direction (e.g., an x-axis direction) across the first support member 410 and the second support member 420. The wiring members 430 may be disposed in the direction (e.g., the x-axis direction) perpendicular to a folding axis (e.g., a y axis or the folding axis A of FIG. 2) of the folding region 303 of the display 300.

According to one embodiment, the board part 450 may include the first board 451 that is disposed on a side of the first support member 410, and the second board 452 that is disposed on a side of the second support member 420. The first board 451 and the second board 452 may be disposed in a space defined by the support member assembly 40, the first lateral member 211, the second lateral member 221, the first rear cover 280, and the second rear cover 290. Components for realizing various functions of the electronic device 20 may be mounted on the first board 451 and the second board 452.

According to one embodiment, the first lateral member 211 and the second lateral member 221 may be assembled to be joined on both sides of the support member assembly 40 in a state in which the display part 30 is joined to the support member assembly 40. According to various embodiments, the first lateral member 211 and the second lateral member 221 may be joined with the support member assembly 40 by sliding on both the sides of the support member assembly 40.

According to various embodiments, at least a part of the first support member 410 may be formed integrally with the first lateral member 211, and may include the same material as the first lateral member 211. According to various embodiments, at least a part of the second support member 420 may be formed integrally with the second lateral member 221, and may include the same material as the second lateral member 221.

According to various embodiments, the first housing structure 210 may be a structure that includes the first lateral member 211 and the first support member 410. According to one embodiment, the second housing structure 220 may be a structure that includes the second lateral member 221 and the second support member 420.

In one embodiment, the first housing structure 210 may include a first rotary support face 212, and the second housing structure 220 may include a second rotary support face 222 corresponding to the first rotary support face 212. The first rotary support face 212 and the second rotary support face 222 may include curved surfaces corresponding to the curved surface included in the hinge cover 230.

In one embodiment, when the electronic device 20 is in the unfolded state (e.g., see FIG. 2), the first rotary support face 212 and the second rotary support face 222 may cover the hinge cover 230, and the hinge cover 230 may not be exposed to the rear face of the electronic device 20 or may be minimally exposed to the rear face of the electronic device 20. When the electronic device 20 is in the folded state (e.g., see FIG. 3), the hinge cover 230 may be maximally exposed between the first rotary support face 212 and the second rotary support face 222.

Figure 5A:
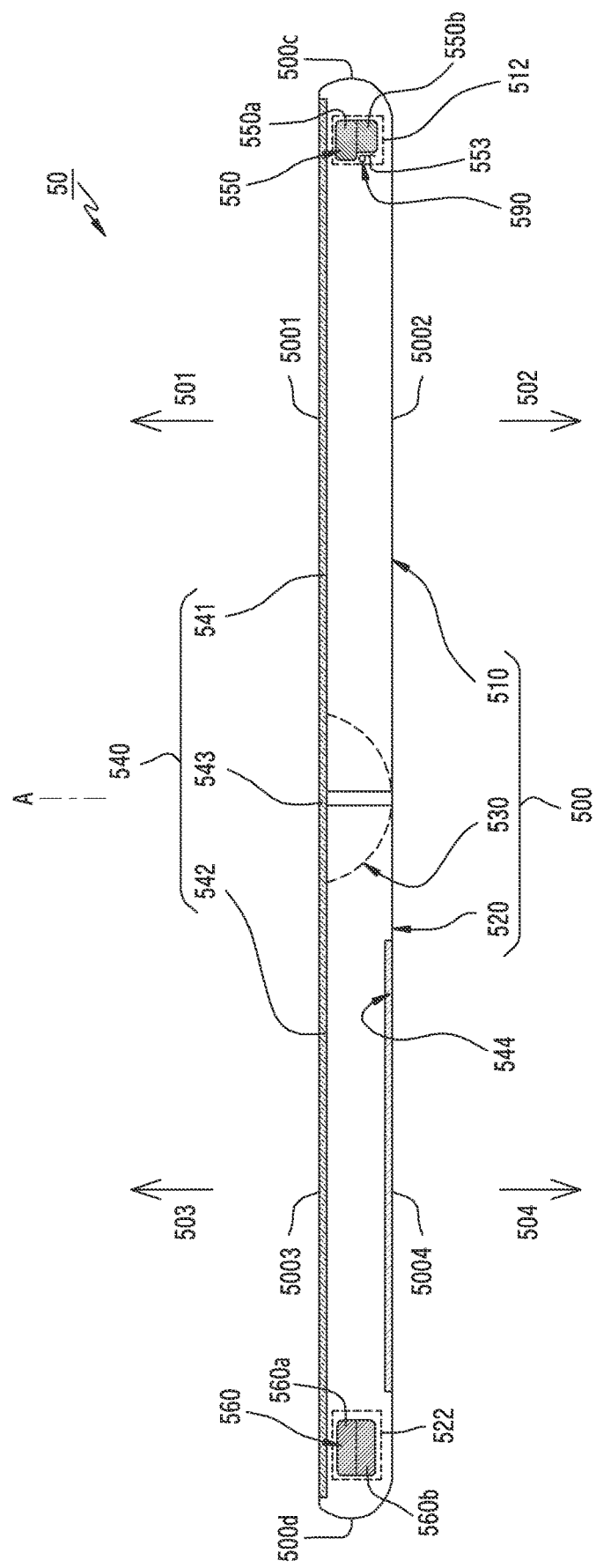
FIG. 5A is a sectional view illustrating an unfolded state of an electronic device according to an embodiment of the disclosure.

FIG. 5A is a sectional view illustrating an unfolded state of an electronic device according to an embodiment of the disclosure.

Figure 5B:
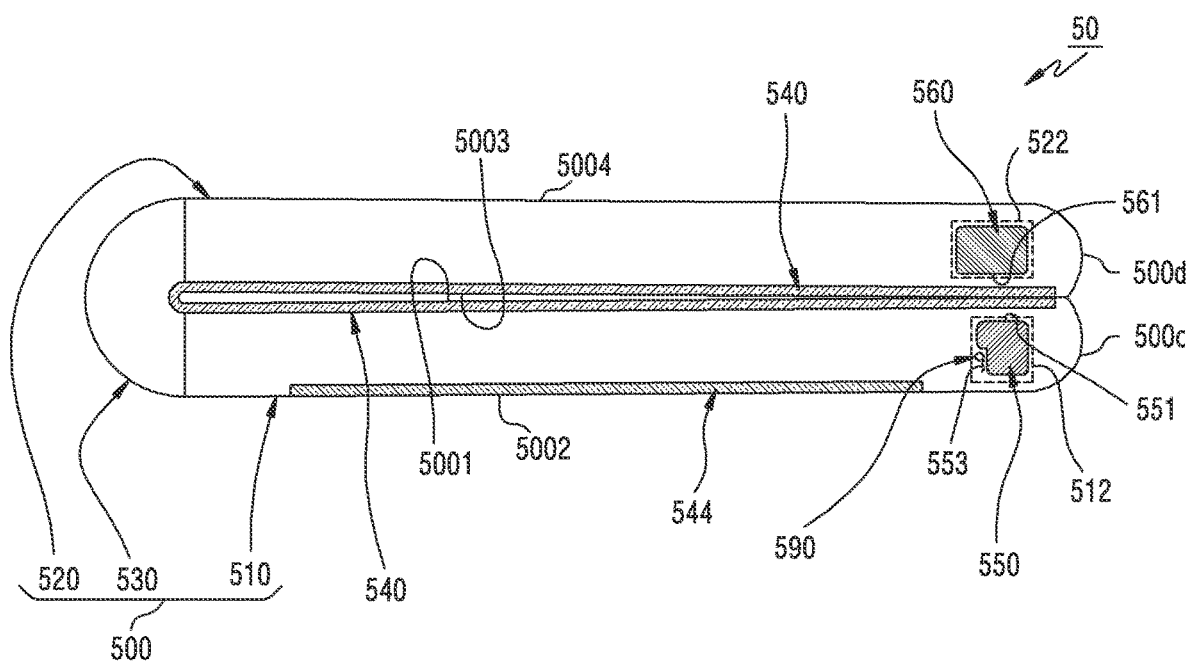
FIG. 5B is a sectional view illustrating a folded state of an electronic device according to an embodiment of the disclosure.

FIG. 5B is a sectional view illustrating a folded state of an electronic device according to an embodiment of the disclosure.

Referring to FIGS. 5A and 5B, in one embodiment, an electronic device 50 (e.g., the electronic device 20 of FIG. 2) may include a foldable housing 500 (e.g., the foldable housing 200 of FIG. 2 or 3), a first display 540 (e.g., the display 300 of FIG. 2), a second display 544 (e.g., the sub-display 293 of FIG. 2), at least one first magnet 550, at least one second magnet 560, or at least one electrical path 590.

According to one embodiment, the foldable housing 500 may include a first housing structure 510 (e.g., the first housing structure 210 of FIG. 2), a second housing structure 520 (e.g., the second housing structure 220 of FIG. 2), or a hinge structure 530 (e.g., the hinge structure 401 of FIG. 4).

According to one embodiment, the first housing structure 510 may include a first face 5001 (e.g., the first face 2001 of FIG. 2) that is directed in a first direction 501 (e.g., the first direction 201 of FIG. 2), and a second face 5002 (e.g., the second face 2002 of FIG. 2) that is directed in a second direction 502 (e.g., the second direction 202 of FIG. 2) opposite to the first direction 501. In the sectional view, the first housing structure 510 may include a third lateral face 500c that is disposed apart from the hinge structure 530 in a space between the first face 5001 and the second face 5002.

According to one embodiment, the second housing structure 520 may include a third face 5003 (e.g., third face 2003 of FIG. 2) that is directed in a third direction 503 (e.g., the third direction 203 of FIG. 2), and a fourth face 5004 (e.g., the fourth face 2004 of FIG. 2) that is directed in a fourth direction 504 (e.g., the fourth direction 204 of FIG. 2) opposite to the third direction 503. In the sectional view, the second housing structure 520 may include a sixth lateral face 500d that is disposed apart from the hinge structure 530 in a space between the third face 5003 and the fourth face 5004. When the electronic device 50 is in an unfolded state (see FIG. 5A), the third lateral face 500c and the sixth lateral face 500d may be disposed in directions opposite to each other. When the electronic device 50 is in a folded state (e.g., see FIG. 5B), the third lateral face 500c and the sixth lateral face 500d may form one lateral face of the electronic device 50 together.

According to one embodiment, the hinge structure 530 may connect the first housing structure 510 and the second housing structure 520, and the first housing structure 510 and the second housing structure 520 can be rotated about the hinge structure 530. According to one embodiment, in the unfolded state (see FIG. 5A), the first direction 501 may be substantially the same as the third direction 503. According to one embodiment, in the folded state (see FIG. 5B), the first face 5001 may face the third face 5003.

According to one embodiment, the first display 540 may extend from the first face 5001 to the third face 5003. The first display 540 may include a first portion 541 that forms at least a part of the first face 5001, and a second portion 542 that forms at least a part of the third face 5003. The first display 540 may include a folding portion 543 (e.g., the folding region 303 of FIG. 2) that connects the first portion 541 and the second portion 542.

According to one embodiment, the second display 544 may be exposed through the fourth face 5004. For example, when viewed above the fourth face 5004, the second display 544 may be disposed to overlap the second portion 542 of the first display 540.

According to one embodiment, the at least one first magnet 550 may be disposed inside the first housing structure 510. According to one embodiment, the at least one second magnet 560 may be disposed inside the second housing structure 520. In the folded state of the electronic device 50 (see FIG. 5B), the at least one first magnet 550 and the at least one second magnet 560 may be disposed to be aligned to or face each other. The folded state of the electronic device 50 may be maintained by an attractive force between the at least one first magnet 550 and the at least one second magnet 560. For example, the attractive force between the at least one first magnet 550 and the at least one second magnet 560 can be made to maintain the folded state against an elastic force of the first display 540 (e.g., a restoring force with which the folding portion 543 attempts to be straightened in a bent state). According to one embodiment, a distance between the at least one first magnet 550 and the at least one second magnet 560 in the folded state of the electronic device 50 may be about 10 mm or less.

According to one embodiment, the first magnet 550 may include a first magnetic pole 550a and a second magnetic pole 550b that have different polarities. The first magnet 550 may be disposed such that the first magnetic pole 550a is directed in the first direction 501 and the second magnetic pole 550b is directed in the second direction 502. The second magnet 560 may include a third magnetic pole 560a and a fourth magnetic pole 560b that have different polarities. The second magnet 560 may be disposed such that the third magnetic pole 560a is directed in the third direction 503 and the fourth magnetic pole 560b is directed in the fourth direction 504. According to one embodiment, the first magnetic pole 550a and the third magnetic pole 560a may have polarities different from each other.

According to various embodiments, when viewed above the second face 5002, at least a part of the at least one first magnet 550 may overlap the first portion 541 of the first display 540. According to various embodiments, when viewed above the fourth face 5004, at least a part of the at least one second magnet 560 may overlap the second portion 542 of the first display 540. For example, the first and second portions 541 and 542 of the first display 540 may be disposed between the at least one first magnet 550 and the at least one second magnet 560 in the folded state of the electronic device 50 (see FIG. 5B).

According to various embodiments, when viewed above the fourth face 5004, the second display 544 may not overlap the at least one second magnet 560. According to various embodiments, a size of the second display 544 is not limited to sizes illustrated in FIGS. 5A and 5B, and may be variously formed. For example, when viewed above the fourth face 5004, the second display 544 may extend to overlap the at least one second magnet 560.

According to one embodiment, in the sectional view, the at least one first magnet 550 may be disposed closer to the third lateral face 500c of the first housing structure 510 than the hinge structure 530. According to one embodiment, the at least one first magnet 550 may be disposed in a first space 512 that is formed around the third lateral face 500c. For example, the first space 512 may be a space formed between the first lateral member 211 and the first support member 410 of FIG. 4. According to various embodiments, the first space 512 may be formed in the first lateral member 211 of FIG. 4 or in a part of the first support member 410 that is close to the first lateral member 211 (e.g., within about 20 mm).

According to one embodiment, in the sectional view, the at least one second magnet 560 may be disposed closer to the sixth lateral face 500d of the second housing structure 520 than the hinge structure 530. According to one embodiment, the at least one second magnet 560 may be disposed in a second space 522 that is formed around the sixth lateral face 500d. For example, the second space 522 may be a space formed between the second lateral member 221 and the second support member 420 of FIG. 4. According to various embodiments, the second space 522 may be formed in the second lateral member 221 of FIG. 4 or in a part of the second support member 420 that is close to the second lateral member 221 (e.g., within about 20 mm).

According to one embodiment, when viewed above the second face 5002, the first space 512 may at least partly overlap the second space 522 in the folded state of the electronic device 50 (see FIG. 5B). According to one embodiment, in the sectional view, the first space 512 and the second space 522 may be asymmetrical in shape with respect to the folding axis A in the unfolded state of the electronic device 50 (see FIG. 5A). According to various embodiments (not illustrated), in the sectional view, the first space 512 and the second space 522 may be substantially symmetrical in shape with respect to the folding axis A in the unfolded state of the electronic device 50.

According to one embodiment, in the sectional view, the at least one first magnet 550 disposed in the first space 512 and the at least one second magnet 560 disposed in the second space 522 may be asymmetrical in shape with respect to the folding axis A in the unfolded state of the electronic device 50 (see FIG. 5A. According to various embodiments (not illustrated), in the sectional view, the at least one first magnet 550 and the at least one second magnet 560 may be substantially symmetrical in shape with respect to the folding axis A in the unfolded state of the electronic device 50.

According to one embodiment, in the sectional view, one face 551 of the at least one first magnet 550 may face one face 561 of the at least one second magnet 560 in the folded state of the electronic device 50 (see FIG. 5B). According to one embodiment, when viewed above the second face 5002, one face 551 of the at least one first magnet 550 may have a smaller area than one face 561 of the at least one second magnet 560 in the folded state of the electronic device 50. According to various embodiments (not illustrated), when viewed above the second face 5002, one face 551 of the at least one first magnet 550 may be formed to have substantially the same area as or a larger area than one face 561 of the at least one second magnet 560 in the folded state of the electronic device 50. According to various embodiments, one face 551 of the at least one first magnet 550 may be substantially parallel to one face 561 of the at least one second magnet 560 in the folded state of the electronic device 50.

According to one embodiment, the at least one electrical path 590 may be disposed in the first space 512. For example, the at least one electrical path 590 may include various conductive members such as a coaxial cable or a flexible printed circuit board (FPCB).

According to one embodiment, the at least one electrical path 590 may be wiring (e.g., a transmission line) for an antenna device or an antenna system (not illustrated) that is included in the electronic device 50. According to various embodiments, the at least one electrical path 590 may be wiring for various other elements.

According to one embodiment, the at least one first magnet 550 may include a recess 553 having a dented shape. According to one embodiment, the at least one electrical path 590 may be disposed in the recess 553. The structure in which the at least one electrical path 590 is disposed in the recess 553 can raise spatial efficiency to dispose the at least one electrical path 590 in a confined internal space of the first housing structure 510 along with the at least one first magnet 550.

According to various embodiments, a position of the recess 553 or the number of recesses 553 is not limited to the example illustrated in FIG. 5A or 5B, and may be changed.

According to any embodiment (not illustrated), the recess 553 may be replaced by a though-hole.

Figure 6:
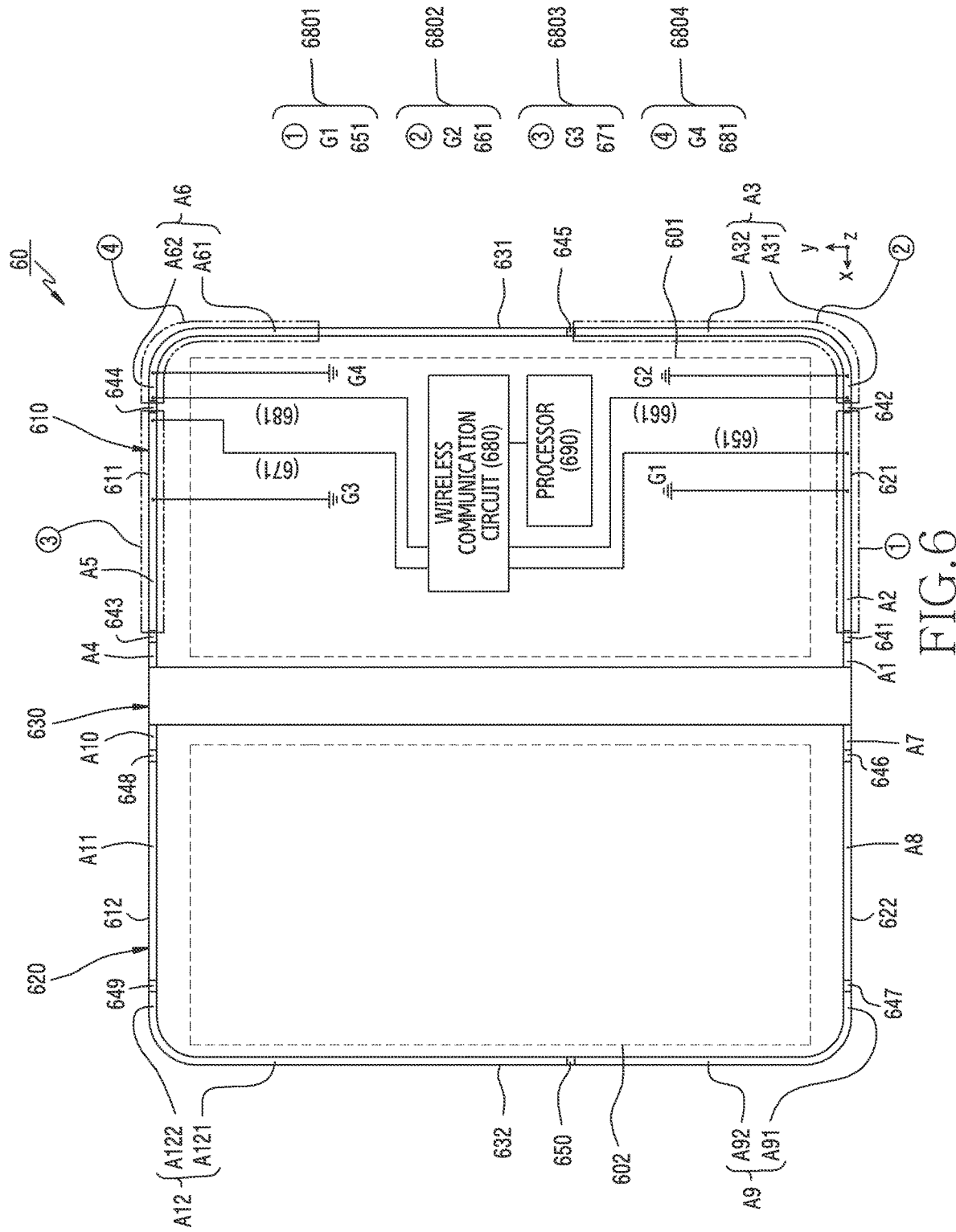
FIG. 6 illustrates an electronic device in an unfolded state according to an embodiment of the disclosure.

FIG. 6 illustrates an electronic device in an unfolded state according to an embodiment of the disclosure.

Referring to FIG. 6, in one embodiment, an electronic device 60 (e.g., the electronic device 20 of FIG. 2 or the electronic device 50 of FIG. 5A) may include at least one of a first lateral member 610 (e.g., the first lateral member 211 of FIG. 2), a second lateral member 620 (e.g., the second lateral member 221 of FIG. 2), a hinge structure 630 (e.g., the hinge structure 530 of FIG. 5A), a wireless communication circuit 680 (e.g., the wireless communication module 192 of FIG. 1), or a processor 690 (e.g., the processor 120 of FIG. 1).

According to one embodiment, the electronic device 60 may include a first lateral face 611 and a fourth lateral face 612 that are directed in a first direction, a second lateral face 621 and a fifth lateral face 622 that are directed in a second direction opposite to the first direction, and a third lateral face 631 and a sixth lateral face 632 that are directed in a third direction perpendicular to the first direction.

According to one embodiment, the first lateral face 611 may be formed by the first lateral member 610, and the fourth lateral face 612 may be formed by the second lateral member 620. When the electronic device 60 is in an unfolded state or a folded state (e.g., see FIG. 3), the first lateral face 611 and the fourth lateral face 612 may form one lateral face of the electronic device 60 together. According to one embodiment, the second lateral face 621 may be formed by the first lateral member 610, and the fifth lateral face 622 may be formed by the second lateral member 620. When the electronic device 60 is in the unfolded state or the folded state (e.g., see FIG. 3), the second lateral face 621 and the fifth lateral face 622 may form the other lateral face of the electronic device 60 together.

According to one embodiment, the third lateral face 631 (e.g., the third lateral face 500c of FIG. 5A) may be formed by the first lateral member 610, and the sixth lateral face 632 (e.g., the sixth lateral face 500d of FIG. 5A) may be formed by the second lateral member 620. When the electronic device 60 is in the unfolded state, the third lateral face 631 and the sixth lateral face 632 may be disposed in directions opposite to each other. When the electronic device 60 is in the folded state (e.g., see FIG. 3), the third lateral face 631 and the sixth lateral face 632 may form one lateral face of the electronic device 60 together.

According to one embodiment, the first lateral member 610 may include a plurality of conductive parts. For example, the first lateral member 610 may include a first conductive part A1, a first insulating part 641, a second conductive part A2, a second insulating part 642, and a third conductive part A3 that are disposed from one side of the hinge structure 630 in order. The first lateral member 610 may include a fourth conductive part A4, a third insulating part 643, a fifth conductive part A5, a fourth insulating part 644, and a sixth conductive part A6 that are disposed from the other side of the hinge structure 630 in order. The first lateral member 610 may include a fifth insulating part 645 between the third conductive parts A3 and the sixth conductive part A6. The fourth and fifth conductive parts A4 and A5 may form a part of the first lateral face 611. The sixth conductive part A6 may include a portion A61 that forms a part of the third lateral face 631, and a portion A62 that forms a part of the first lateral face 611. The first and second conductive parts A1 and A2 may form a part of the second lateral face 621. The third conductive part A3 may include a portion A31 that forms a part of the second lateral face 621, and a portion A32 that forms a part of the third lateral face 631.

According to one embodiment, the first insulating part 641 may be disposed between the first and second conductive parts A1 and A2, and may form a part of the second lateral face 621. The first and second conductive parts A1 and A2 may be electrically or physically separated by the first insulating part 641. The second insulating part 642 may be disposed between the second and third conductive parts A2 and A3, and may form a part of the second lateral face 621. The second and third conductive parts A2 and A3 may be electrically or physically separated by the second insulating part 642. The third insulating part 643 may be disposed between the fourth and fifth conductive parts A4 and A5, and may form a part of the first lateral face 611. The fourth and fifth conductive parts A4 and A5 may be electrically or physically separated by the third insulating part 643. The fourth insulating part 644 may be disposed between the fifth and sixth conductive parts A5 and A6, and may form a part of the first lateral face 611. The fifth and sixth conductive parts A5 and A6 may be electrically or physically separated by the fourth insulating part 644. The fifth insulating part 645 may be disposed between the third and sixth conductive parts A3 and A6, and may form a part of the third lateral face 631. The third and sixth conductive parts A3 and A6 may be electrically or physically separated by the fifth insulating part 645.

According to one embodiment, the second lateral member 620 may include a plurality of conductive parts. For example, the second lateral member 620 may include a seventh conductive part A7, a sixth insulating part 646, an eighth conductive part A8, a seventh insulating part 647, and a ninth conductive part A9 that are disposed from one side of the hinge structure 630 in order. The second lateral member 620 may include a tenth conductive part A10, an eighth insulating part 648, an eleventh conductive part A11, a ninth insulating part 649, and a twelfth conductive part A12 that are disposed from the other side of the hinge structure 630 in order. The second lateral member 620 may include a tenth insulating part 650 between the ninth conductive parts A9 and the twelfth conductive part A12. The tenth and eleventh conductive parts A10 and A11 may form a part of the fourth lateral face 612. The twelfth conductive part A12 may include a portion A121 that forms a part of the sixth lateral face 632, and a portion A122 that forms a part of the fourth lateral face 612. The seventh and eighth conductive parts A7 and A8 may form a part of the fifth lateral face 622. The ninth conductive part A9 may include a portion A91 that forms a part of the fifth lateral face 622, and a portion A92 that forms a part of the sixth lateral face 632.

According to one embodiment, the sixth insulating part 646 may be disposed between the seventh and eighth conductive parts A7 and A8, and may form a part of the fifth lateral face 622. The seventh and eighth conductive parts A7 and A8 may be electrically or physically separated by the sixth insulating part 646. The seventh insulating part 647 may be disposed between the eighth and ninth conductive parts A8 and A9, and may form a part of the fifth lateral face 622. The eighth and ninth conductive parts A8 and A9 may be electrically or physically separated by the seventh insulating part 647. The eighth insulating part 648 may be disposed between the tenth and eleventh conductive parts A10 and A11, and may form a part of the fourth lateral face 612. The tenth and eleventh conductive parts A10 and A11 may be electrically or physically separated by the eighth insulating part 648. The ninth insulating part 649 may be disposed between the eleventh and twelfth conductive parts A11 and A12, and may form a part of the fourth lateral face 612. The eleventh and twelfth conductive parts A11 and A12 may be electrically or physically separated by the ninth insulating part 649. The tenth insulating part 650 may be disposed between the ninth and twelfth conductive parts A9 and A12, and may form a part of the sixth lateral face 632. The ninth and twelfth conductive parts A9 and A12 may be electrically or physically separated by the tenth insulating part 650. For example, the first insulating part 641, the second insulating part 642, the third insulating part 643, the fourth insulating part 644, or the fifth insulating part 645 may be the first non-conductive member 271 of FIG. 2. For example, the sixth insulating part 646, the seventh insulating part 647, the eighth insulating part 648, the ninth insulating part 649, or the tenth insulating part 650 may be the second non-conductive members 272 of FIG. 2.

According to one embodiment, the first insulating part 641 and the sixth insulating part 646, the second insulating part 642 and the seventh insulating part 647, the third insulating part 643 and the eighth insulating part 648, the fourth insulating part 644 and the ninth insulating part 649, and the fifth insulating part 645 and the tenth insulating part 650 may be substantially aligned to each other in the folded state of the electronic device 60 (see FIG. 3).

According to one embodiment, when viewed above a second face (e.g., the second face 5002 of FIG. 5A), the first conductive parts A1 and the seventh conductive part A7, the second conductive parts A2 and the eighth conductive part A8, the third conductive parts A3 and the ninth conductive part A9, the fourth conductive parts A4 and the tenth conductive part A10, the fifth conductive parts A5 and the eleventh conductive part A11, or the sixth conductive parts A6 and the twelfth conductive part A12 may at least partly overlap each other in the folded state of the electronic device 60 (see FIG. 3).

According to one embodiment, at least one of the first, second, third, fourth, fifth and sixth conductive parts A1, A2, A3, A4, A5 and A6 of the first lateral member 610 may be electrically connected to the wireless communication circuit 680 (e.g., a radio frequency integrated circuit (RFIC) or an intermediate frequency integrated circuit (IFIC), and be utilized as an antenna radiator.

For example, the second conductive part A2 may be operated as a first antenna radiator ①. The first antenna radiator ① may be electrically connected to the wireless communication circuit 680 at least one feeding point (not illustrated), and may be electrically connected to a ground G1 at least one grounding point (not illustrated). According to one embodiment, a first antenna system 6801 may include the first antenna radiator ①, the ground G1 that is electrically connected to the first antenna radiator ①, or a first transmission line 651 between the first antenna radiator ① and the wireless communication circuit 680. The first transmission line 651 may be defined as a conductor system that acts as a structure for transmitting radio frequency (RF) signals (voltages, currents) through the first antenna radiator ① and makes use of a propagation action of waves according to an electric element (e.g., an element having resistance, inductance, conductance, or capacitance per unit length). The first transmission line 651 may include various types of wiring that connect the wireless communication circuit 680 and the first antenna radiator ①. The wireless communication circuit 680 may provide a current (e.g., a radiation current or a radio signal) to the first antenna radiator ① through the first transmission line 651, and transmit or receive radio electromagnetic waves through the first antenna radiator ①.

For example, the third conductive part A3 may be operated as a second antenna radiator ②. The second antenna radiator ② may be electrically connected to the wireless communication circuit 680 at least one feeding point (not illustrated), and may be electrically connected to a ground G2 at least one grounding point (not illustrated). According to one embodiment, a second antenna system 6802 may include the second antenna radiator ②, the ground G2 that is electrically connected to the second antenna radiator ②, or a second transmission line 661 between the second antenna radiator ② and the wireless communication circuit 680). The second transmission line 661 may be defined as a conductor system that acts as a structure for transmitting radio frequency (RF) signals (voltages, currents) through the second antenna radiator ② and makes use of a propagation action of waves according to an electric element (e.g., an element having resistance, inductance, conductance, or capacitance per unit length). The second transmission line 661 may include various types of wiring that connect the wireless communication circuit 680 and the second antenna radiator ②. The wireless communication circuit 680 may provide a current (e.g., a radiation current or a radio signal) to the second antenna radiator ② through the second transmission line 661, and transmit or receive radio electromagnetic waves through the second antenna radiator ②.

For example, the fifth conductive part A5 may be operated as a third antenna radiator ③. The third antenna radiator ③ may be electrically connected to the wireless communication circuit 680 at least one feeding point (not illustrated), and may be electrically connected to a ground G3 at least one grounding point (not illustrated). According to one embodiment, a third antenna system 6803 may include the third antenna radiator ③, the ground G3 that is electrically connected to the third antenna radiator ③, or a third transmission line 671 between the third antenna radiator ③ and the wireless communication circuit 680. The third transmission line 671 may be defined as a conductor system that acts as a structure for transmitting radio frequency (RF) signals (voltages, currents) through the third antenna radiator ③ and makes use of a propagation action of waves according to an electric element (e.g., an element having resistance, inductance, conductance, or capacitance per unit length). The third transmission line 671 may include various types of wiring that connect the wireless communication circuit 680 and the third antenna radiator ③. The wireless communication circuit 680 may provide a current (e.g., a radiation current or a radio signal) to the third antenna radiator ③ through the third transmission line 671, and transmit or receive radio electromagnetic waves through the third antenna radiator ③.

For example, a part (not illustrated) of the sixth conductive part A6 that is disposed between the first lateral face 611 and the third lateral face 631) and forms a part of the third lateral face 631 and a part of the first lateral face 611 may be operated as a fourth antenna radiator ④. The fourth antenna radiator ④ may be electrically connected to the wireless communication circuit 680 at least one feeding point (not illustrated), and may be electrically connected to a ground G4 at least one grounding point (not illustrated). According to one embodiment, a fourth antenna system 6804 may include the fourth antenna radiator ④, the ground G4 that is electrically connected to the fourth antenna radiator ④, or a fourth transmission line 681 between the fourth antenna radiator ④ and the wireless communication circuit 680. The fourth transmission line 681 may be defined as a conductor system that acts as a structure for transmitting radio frequency (RF) signals (voltages, currents) through the fourth antenna radiator ④ and makes use of a propagation action of waves according to an electric element (e.g., an element having resistance, inductance, conductance, or capacitance per unit length). The fourth transmission line 681 may include various types of wiring that connect the wireless communication circuit 680 and the fourth antenna radiator ④. The wireless communication circuit 680 may provide a current (e.g., a radiation current or a radio signal) to the fourth antenna radiator ④ through the fourth transmission line 681, and transmit or receive radio electromagnetic waves through the fourth antenna radiator ④.

According to one embodiment, at least one of the ground G1, G2, G3 and G4 may be at least one ground or at least one ground layer that is disposed on a first PCB 601 (e.g., the first board 451 of FIG. 4) on which the wireless communication circuit 680 or the processor 690 is disposed. According to various embodiments, the first PCB 601 may include a plurality of PCBs that are electrically connected, and the ground G1, G2, G3 or G4 may be a ground included in at least one of the plurality of PCBs.

According to one embodiment, a reflection characteristic and impedance of the antenna radiator (e.g., the first antenna radiator ①, the second antenna radiator ②, the third antenna radiator ③, or the fourth antenna radiator ④) have relation to antenna radiation performance, and may be diversified according to a shape, size, or material of the antenna radiator. A radiation characteristic of the antenna radiator may include an antenna radiation pattern (or an antenna pattern) that is a directivity function that indicates the relative distribution of power radiated at the antenna radiator, and a polarized state (or antenna polarization) of radio waves radiated at the antenna radiator. The impedance of the antenna radiator may have relation to power transfer to the antenna radiator from a transmitter (e.g., the wireless communication circuit 680) or power transfer to a receiver (e.g., the wireless communication circuit 680) from the antenna radiator. To minimize reflection at a connection part between the transmission line (e.g., the first transmission line 651, the second transmission line 661, the third transmission line 671, or the fourth transmission line 681) and the antenna radiator (e.g., the first antenna radiator ①, the second antenna radiator ②, the third antenna radiator ③, or the fourth antenna radiator ④), the impedance of the antenna radiator is designed to be matched with the impedance of the transmission line, and thus maximum power transfer (or minimum power loss) or efficient signal transfer based on the antenna radiator is possible. This impedance matching can guide an efficient flow of signals at a specific frequency.

According to various embodiments, the first transmission line 651, the second transmission line 661, the third transmission line 671, or the fourth transmission line 681 may be the at least one electrical path 590 of FIG. 5A or FIG. 5B.

According to one embodiment, a frequency band which the electronic device 60 can utilize may include a low band (LB) of about 600 MHz to 1 GHz, a middle band (MB) of about 1 to 2.3 GHz, a high band (HB) of about 2.3 to 2.7 GHz, or an ultra high band (UHB) of about 2.7 to 6 GHz. According to various embodiments, the electronic device 60 may further utilize other frequency bands. According to one embodiment, the first antenna system 6801, the second antenna system 6802, the third antenna system 6803, or the fourth antenna system 6804 may support a communication mode that uses at least one of the LB, the MB, the HB or the UHB. For example, the first antenna system 6801, the second antenna system 6802, the third antenna system 6803, or the fourth antenna system 6804 may support various communication services such as a global system for mobile communication (GSM), long term evolution (LTE), or a 5th generation (5G) network that utilizes the corresponding frequency band.

According to various embodiments, the wireless communication circuit 680 may support at least one communication technique of single input multiple output (SIMO), multiple input single output (MISO), diversity, or multiple input multiple output (MIMO) using at least one antenna radiator (e.g., the first antenna radiator ①, the second antenna radiator ②, the third antenna radiator ③, or the fourth antenna radiator ④).

According to one embodiment, the wireless communication circuit 680 or the processor 690 may transmit or receive data through the MIMO technique using a plurality of antenna radiators in a communication mode that uses the corresponding frequency band. According to one embodiment, the electronic device 60 may include a memory (e.g., the memory 130 of FIG. 1) that is electrically connected to the processor 690. The memory may store instructions to cause the processor 690 to transmit or receive data through the MIMO technique selectively using the plurality of antenna radiator of the first antenna radiator ①, the second antenna radiator ②, the third antenna radiator ③, or the fourth antenna radiator ④ on the basis of the communication mode.

For example, the MIMO technique may include a beamforming scheme that regulates phase information of each antenna radiator, controls signal intensity according to a positional angle between a base station (or a transmitter) and a user, and removes interference of surroundings to improve performance. For example, the MIMO technique may include a diversity scheme that keeps a distance between antenna radiators to improve performance in order to independently make signals among the antenna radiators. For example, the MIMO technique may include a multiplexing scheme that makes virtual auxiliary channels among transmitting and receiving antenna radiators, transmits different data through the transmitting antennas to increase a transmission rate. According to one embodiment, a technique for a base station transmitting different data through each transmitting antenna and the electronic device 60 dividing the transmitted data through adequate signaling may be utilized. For example, 4×4 MIMO technique may utilize four antennas for a base station (or a transmitter) and the electronic device 60 (or a receiver). For example, the wireless communication circuit 680 or the processor 690 may transmit or receive the data through the first antenna radiator ①, the second antenna radiator ②, the third antenna radiator ③, or the fourth antenna radiator ④ using the MIMO technique. According to various embodiments, the third antenna radiator ③ and the fourth antenna radiator ④ may be operated as diversity antennas.

According to one embodiment, the wireless communication circuit 680 may be configured to transmit and/or receive different frequency signals in a specified frequency band through the first antenna radiator ①, the second antenna radiator ②, the third antenna radiator ③, or the fourth antenna radiator ④.

According to various embodiments, the wireless communication circuit 680 may be configured to receive specified frequency signals through the first antenna radiator ①, the second antenna radiator ②, the third antenna radiator ③, or the fourth antenna radiator ④.

According to various embodiments, the electronic device 60 may further include at least one fifth antenna radiator (not illustrated) that is disposed inside the electronic device 60 and is electrically connected to the wireless communication circuit 680. The at least one fifth antenna radiator may be electrically connected to the ground of the first PCB 601. According to any embodiment, the at least one fifth antenna radiator may not be electrically connected to the ground of the first PCB 601. According to various embodiments, the wireless communication circuit 680 may be configured to select four from among the first antenna radiator ①, the second antenna radiator ②, the third antenna radiator ③, the fourth antenna radiator ④, and the at least one fifth antenna radiator and to receive specified frequency signals through the selected four antenna radiators.

Figure 7:
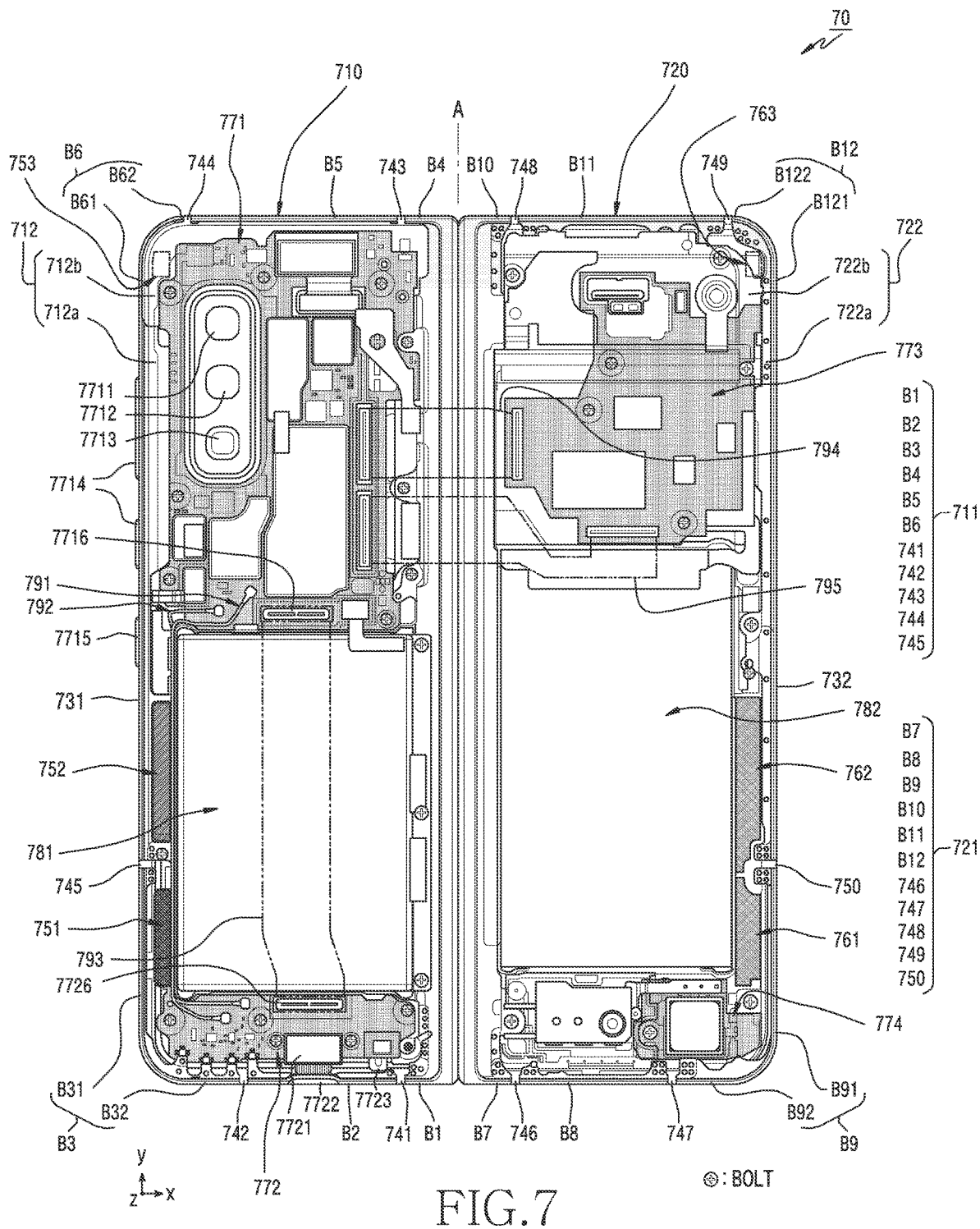
FIG. 7 illustrates an electronic device in an unfolded state according to an embodiment of the disclosure.

FIG. 7 illustrates an electronic device in an unfolded state according to an embodiment of the disclosure.

Referring to FIG. 7, an electronic device 70 (e.g., the electronic device 20 of FIG. 2, the electronic device 50 of FIG. 5A, or the electronic device 60 of FIG. 6) may include at least one of a first housing structure 710, a second housing structure 720, a plurality of first magnets 751, 752, and 753, a plurality of second magnets 761, 762, and 763, a first PCB 771, a second PCB 772, a third PCB 773, a fourth PCB 774, a first battery 781, a second battery 782, a first electrical path 791, a second electrical path 792, a third electrical path 793, a fourth electrical path 794, or a fifth electrical path 795.

According to one embodiment, the first housing structure 710 may include a first lateral member 711 and a first support member 712. For example, the first lateral member 711 (e.g., the first lateral member 211 of FIG. 2) may include a first conductive part B1 (e.g., the first conductive part A1 of FIG. 6), a second conductive part B2 (e.g., the second conductive part A2 of FIG. 6), a third conductive part B3 (e.g., the third conductive part A3 of FIG. 6), a fourth conductive part B4 (e.g., the fourth conductive part A4 of FIG. 6), a fifth conductive part B5 (e.g., the fifth conductive part A5 of FIG. 6), or a sixth conductive part B6 (e.g., the sixth conductive part A6 of FIG. 6), and may include a first insulating part 741 (e.g., the first insulating part 641 of FIG. 6)), a second insulating part 742 (e.g., the second insulating part 642 of FIG. 6)), a third insulating part 743 (e.g., the third insulating part 643 of FIG. 6), a fourth insulating part 744 (e.g., the fourth insulating part 644 of FIG. 6), or a fifth insulating part 745 (e.g., the fifth insulating part 645 of FIG. 6). According to one embodiment, the first support member 712 (e.g., the first support member 410 of FIG. 4) may include a first inner conductive part 712a that is formed integrally with or is physically connected to the at least one conductive part (e.g., the first conductive part B1, the second conductive part B2, the third conductive part B3, the fourth conductive part B4, the fifth conductive part B5, or the sixth conductive part B6) of the first lateral member 711. According to one embodiment, the first support member 712 may include a first inner non-conductive part 712b joined with the first inner conductive part 712a. For example, the first insulating part 741, the second insulating part 742, the third insulating part 743, the fourth insulating part 744, or the fifth insulating part 745 may be formed integrally with or be physically connected to the first inner non-conductive part 712b.

According to one embodiment, the second housing structure 720 may include a second lateral member 721 and a second support member 722. For example, the second lateral member 721 (e.g., the second lateral member 221 of FIG. 2) may include a seventh conductive part B7 (e.g., the seventh conductive part A7 of FIG. 6), an eighth conductive part B8 (e.g., the eighth conductive part A8 of FIG. 6), a ninth conductive part B9 (e.g., the ninth conductive part A9 of FIG. 6), a tenth conductive part B10 (e.g., the tenth conductive part A10 of FIG. 6), an eleventh conductive part B11 (e.g., the eleventh conductive part A11 of FIG. 6), or a twelfth conductive part B12 (e.g., the twelfth conductive part A12 of FIG. 6), and may include a sixth insulating part 746 (e.g., the sixth insulating part 646 of FIG. 6), a seventh insulating part 747 (e.g., the seventh insulating part 647 of FIG. 6), an eighth insulating part 748 (e.g., the eighth insulating part 648 of FIG. 6), a ninth insulating part 749 (e.g., the ninth insulating part 649 of FIG. 6), or a tenth insulating part 750 (e.g., the tenth insulating part 650 of FIG. 6). According to one embodiment, the second support member 722 (e.g., the second support member 420 of FIG. 4) may include a second inner conductive part 722a that is formed integrally with or is physically connected to the at least one conductive parts (e.g., the seventh conductive part B7, the eighth conductive part B8, the ninth conductive part B9, the tenth conductive part B10, the eleventh conductive part B11, or the twelfth conductive part B12) of the second lateral member 721. According to one embodiment, the second support member 722 may include a second inner non-conductive part 722b joined with the second inner conductive part 722a. For example, the sixth insulating part 746, the seventh insulating part 747, the eighth insulating part 748, the ninth insulating part 749, or the tenth insulating part 750 may be formed integrally with or be physically connected to the second inner non-conductive part 722b.

According to one embodiment, the first PCB 771 and/or the second PCB 772 may be joined with the first support member 712 by fastening elements such as screws. According to one embodiment, when viewed above a second face (e.g., the second face 2002 of FIG. 2 or the second face 5002 of FIG. 5A), the first PCB 771 may be disposed closer to the fifth conductive part B5 than the second conductive part B2, and the second PCB 772 may be disposed closer to the second conductive part B2 than the fifth conductive part B5. According to various embodiments, the first board 451 of FIG. 4 or the first PCB 601 of FIG. 6 may include the first PCB 771 and the second PCB 772.

For example, various elements such as a camera module (e.g., a camera 7711 and a flash 7712), a sensor module 7713 (e.g., an optical sensor module such as a fingerprint sensor), a wireless communication module (e.g., the wireless communication module 192 of FIG. 1), and a processor (e.g., the processor 120 of FIG. 1) may be disposed on the first PCB 771. According to various embodiments, one or more components 245 of FIG. 2 may be mounted on the first PCB 771, or may be electrically connected to the first PCB 771. According to various embodiments, key input devices 7714 and 7715 (e.g., the key input devices 243 of FIG. 2) may be disposed in a through-hole (not illustrated) formed in at least a part (e.g., the sixth conductive part B6) of the first lateral member 711, and be electrically connected to the first PCB 771.

For example, various elements such as a connector 7721 (e.g., a USB connector) that corresponds to a connector hole 7722 (e.g., the connector hole 244 of FIG. 2) formed in the second conductive part B2, a microphone 7723 that corresponds to a microphone hole (e.g., the microphone hole 241 of FIG. 2), or a speaker (not illustrated) that corresponds to a speaker hole (e.g., the speaker hole 242 of FIG. 2) may be disposed on the second PCB 772.

According to one embodiment, the first PCB 771 may include a fifth connector 7716, and the second PCB 772 may include a sixth connector 7726. The fifth connector 7716 and the sixth connector 7726 may be electrically connected through the third electrical path 793 such as an FPCB. The first PCB 771 and the second PCB 772 may exchange various signals through the third electrical path 793.

According to one embodiment, when viewed above the second face (e.g., the second face 2002 of FIG. 2 or the second face 5002 of FIG. 5A), the first battery 781 may be disposed between the first PCB 771 and the second PCB 772. According to one embodiment, when viewed above the second face (e.g., the second face 2002 of FIG. 2), the first battery 781 may be rectangular. According to one embodiment, when viewed above the second face, the fifth connector 7716 may be disposed between the first battery 781 and the fifth conductive part B5. According to one embodiment, when viewed above the second face, the sixth connector 7726 may be disposed between the first battery 781 and the second conductive part B2. For example, the fifth connector 7716 or the sixth connector 7726 may be disposed around the first battery 781 (e.g., within about 20 mm). According to one embodiment, when viewed above the second face, the third electrical path 793 (e.g., FPCB) may be disposed across the first battery 781.

According to one embodiment, when viewed above the second face (e.g., the second face 2002 of FIG. 2), the plurality of first magnets 751, 752, and 753 (e.g., the at least one first magnet 550 of FIG. 5A) may be disposed along the third lateral face 731 (e.g., the third lateral face 631 of FIG. 6) that is formed by the first lateral member 711. According to one embodiment, when viewed above the second face, the plurality of first magnets 751, 752, and 753 may be disposed around the third lateral face 731 (e.g., within about 20 mm). According to one embodiment, the plurality of first magnets 751, 752, and 753 may be disposed around a part B31 of the third conductive part B3 that is substantially parallel to the folding axis A, or around a part B61 of the sixth conductive part B6 (e.g., within about 10 mm). For example, when viewed above the second face, one first magnet 751 may be at least partly disposed between the part B31 of the third conductive part B3 and the first battery 781. For example, when viewed above the second face, the other first magnets 752, and 753 may be at least partly disposed between the part B61 of the sixth conductive part B6 and the first battery 781.

According to one embodiment, the plurality of first magnets 751, 752, and 753 may be disposed in a first space (e.g., the first space 512 of FIG. 5A) formed around the third lateral face 731. According to one embodiment, the first space may be a space formed between the first lateral member 711 and the first support member 712. According to various embodiments, the first space may be formed in the first lateral member 711 or in a portion of the first support member 712 that is close to the first lateral member 711 (e.g., within about 20 mm). For example, when viewed above the second face (e.g., the second face 2002 of FIG. 2), at least a part of the first space may be disposed between the third lateral face 731 and the first battery 781.

According to one embodiment, when viewed above the second face (e.g., the second face 2002 of FIG. 2), at least some of the plurality of first magnets 751, 752, and 753 may not overlap the first PCB 771 and/or the second PCB 772. According to various embodiments (not illustrated), at least one of the first magnets may be disposed at various other positions that are close to the third lateral face 731. For example, when viewed above the second face, at least one of the first magnets may be disposed between the part B61 of the sixth conductive part B6 and the first PCB 771. For example, when viewed above the second face, at least one of the first magnets may be disposed between the part B31 of the third conductive part B3 and the second PCB 772.

According to one embodiment, the third PCB 773 and/or the fourth PCB 774 may be joined with the second support member 722 by fastening elements such as screws. According to one embodiment, when viewed above a fourth face (e.g., the fourth face 2004 of FIG. 2 or the fourth face 5004 of FIG. 5A), the third PCB 773 may be disposed closer to the eleventh conductive part B11 than the eighth conductive part B8, and the fourth PCB 774 may be disposed closer to the eighth conductive part B8 than the eleventh conductive part B11. According to various embodiments, the second board 452 of FIG. 4 may include the third PCB 773 and the fourth PCB 774. According to various embodiments, various elements such as the sub-display 293 of FIG. 2 or the second display 544 of FIG. 5A may be electrically connected to the third PCB 773 and/or the fourth PCB 774, or may be mounted on the third PCB 773 and/or the fourth PCB 774.

According to one embodiment, when viewed above the fourth face (e.g., the fourth face 2004 of FIG. 2 or the fourth face 5004 of FIG. 5A), the second battery 782 may be disposed between the third PCB 773 and the fourth PCB 774. According to one embodiment, when viewed above the fourth face (e.g., the fourth face 2004 of FIG. 2), the second battery 782 may be rectangular.

According to one embodiment, when viewed above the fourth face (e.g., the fourth face 2004 of FIG. 2), the plurality of second magnets 761, 762, and 763 (e.g., the at least one second magnet 560 of FIG. 5A) may be disposed along the sixth lateral face 732 (e.g., the sixth lateral face 632 of FIG. 6) that is formed by the second lateral member 721. According to one embodiment, when viewed above the fourth face, the plurality of second magnets 761, 762, and 763 may be disposed around the sixth lateral face 732 (e.g., within about 20 mm). According to one embodiment, the plurality of second magnets 761, 762, and 763 may be disposed around a part B91 of the ninth conductive part B9 that is substantially parallel to the folding axis A, or around a part B121 of the twelfth conductive part B12 (e.g., within about 10 mm). For example, when viewed above the fourth face, one second magnet 761 may be at least partly disposed between the part B91 of the ninth conductive part B9 and the second battery 782. For example, when viewed above the fourth face, the other second magnets 762, and 763 may be at least partly disposed between the part B121 of the twelfth conductive part B12 and the second battery 782.

According to one embodiment, the plurality of second magnets 761, 762, and 763 may be disposed in a second space (e.g., the second space 522 of FIG. 5A) that is formed around the sixth lateral face 732. According to one embodiment, the second space may be a space formed between the second lateral member 721 and the second support member 722. According to various embodiments, the second space may be formed in the second lateral member 721, or in a portion of the second support member 722 that is close to the second lateral member 721 (e.g., within about 20 mm). For example, when viewed above the fourth face (e.g., the fourth face 2004 of FIG. 2), at least a part of the second space may be disposed between the sixth lateral face 732 and the second battery 782.

According to one embodiment, when viewed above the fourth face (e.g., the fourth face 2004 of FIG. 2), at least some of the plurality of second magnets 761, 762, and 763 may not overlap the third PCB 773 and/or the fourth PCB 774. According to various embodiments (not illustrated), at least one of the second magnets may be disposed at various positions that are close to the sixth lateral face 732. For example, when viewed above the fourth face, at least one of the second magnets may be disposed between the part B121 of the twelfth conductive part B12 and the third PCB 773. For example, when viewed above the fourth face, at least one of the second magnets may be disposed between the part B91 of the ninth conductive part B9 and the fourth PCB 774.

According to one embodiment, the plurality of first magnets 751, 752, and 753 and the plurality of second magnets 761, 762, and 763 may be disposed to be aligned to or face each other in the folded state of the electronic device 70 (see FIG. 5B). The folded state of the electronic device 70 may be maintained by attractive forces between the plurality of first magnets 751, 752, and 753 and the plurality of second magnets 761, 762, and 763.

According to one embodiment, the first magnet 751, 752, or 753 may include a first magnetic pole (e.g., the first magnetic pole 550a of FIG. 5A) and a second magnetic pole (e.g., the second magnetic pole 550b of FIG. 5A), both of which have polarities different from each other. The first magnet 751, 752, or 753 may be disposed such that the first magnetic pole thereof is directed in a first direction (e.g., the first direction 501 of FIG. 5A) and the second magnetic pole thereof is directed in a second direction (e.g., the second direction 502 of FIG. 5A). The second magnet 761, 762 or 763 may include a third magnetic pole (e.g., the third magnetic pole 560a of FIG. 5A) and a fourth magnetic pole (e.g., the fourth magnetic pole 560b of FIG. 5A), both of which have polarities different from each other. The second magnet 761, 762 or 763 may be disposed such that the third magnetic pole thereof is directed in a third direction (e.g., the third direction 503 of FIG. 5A) and the fourth magnetic pole thereof is directed in a fourth direction (e.g., the fourth direction 504 of FIG. 5A). According to one embodiment, the first magnetic pole and the third magnetic pole may have the polarities (e.g., S or N polarity) different from each other.

According to various embodiments, the polarities of the plurality of first magnets 751, 752, and 753 may be arranged to be equal to one another. According to various embodiments, the polarities of one first magnet of the plurality of first magnets 751, 752, and 753 may be arranged to be different from those of the other first magnet.

According to various embodiments, positions or number of the first magnets disposed in the first housing structure 710 or the second magnets disposed in the second housing structure 720 are not limited to the example illustrated in FIG. 7, and may be changed.

According to one embodiment, the first electrical path 791 and the second electrical path 792 may electrically connect the first PCB 771 and the second PCB 772. According to one embodiment, when viewed above the second face (e.g., the second face 2002 of FIG. 2, a part of the first electrical path 791 and/or a part of the second electrical path 792 may be disposed in the first space (e.g., the first space 512 of FIG. 5A) formed around the third lateral face 731. For example, a part of the first electrical path 791 and/or a part of the second electrical path 792 may be disposed in the first space along with the plurality of first magnets 751 and 752.

According to one embodiment, the plurality of first magnets 751 and 752 may include recesses (e.g., the recess 553 of FIG. 5A), a part of the first electrical path 791 and/or a part of the second electrical path 792 may be disposed in the recesses.

According to one embodiment, the first electrical path 791 or the second electrical path 792 may be wiring (e.g., a transmission line) for at least one antenna system. For example, the first electrical path 791 or the second electrical path 792 may be a transmission line for an antenna system (e.g., the first antenna system 6801 of FIG. 6) that utilizes the second conductive part B2, and/or a transmission line for an antenna system (e.g., the second antenna system 6802 of FIG. 6) that utilizes the third conductive part B3.

According to one embodiment, the fourth electrical path 794 (e.g., an FPCB) or the fifth electrical path 795 (e.g., an FPCB) may electrically connect the first PCB 771 and the third PCB 773 that are respectively disposed in the first housing structure 710 and the second housing structure 720 across the hinge structure (e.g., the hinge structure 530 of FIG. 5A).

According to various embodiments, the electronic device 70 may include at least one fifth electrical path (not illustrated) that electrically connects the third PCB 773 and the fourth PCB 774. According to various embodiments, when viewed above the fourth face (e.g., the fourth face 2004 of FIG. 2), at least a part of the fifth electrical path may be disposed in the second space (e.g., the second space 522 of FIG. 5A) formed around the sixth lateral face 732). According to various embodiments, at least a part of the fifth electrical path may be disposed in the second space along with the plurality of second magnets 761 and 762. According to various embodiments, the plurality of second magnets 761 and 762 may include recesses like the first magnets (e.g., the first magnet 550 of FIG. 5A), and a part of the fifth electrical path may be disposed in the recess.

According to one embodiment, the first electrical path 791 or the second electrical path 792 may be a coaxial cable. According to various embodiments, the first electrical path 791 or the second electrical path 792 may be various other conductive members.

Figure 8A:
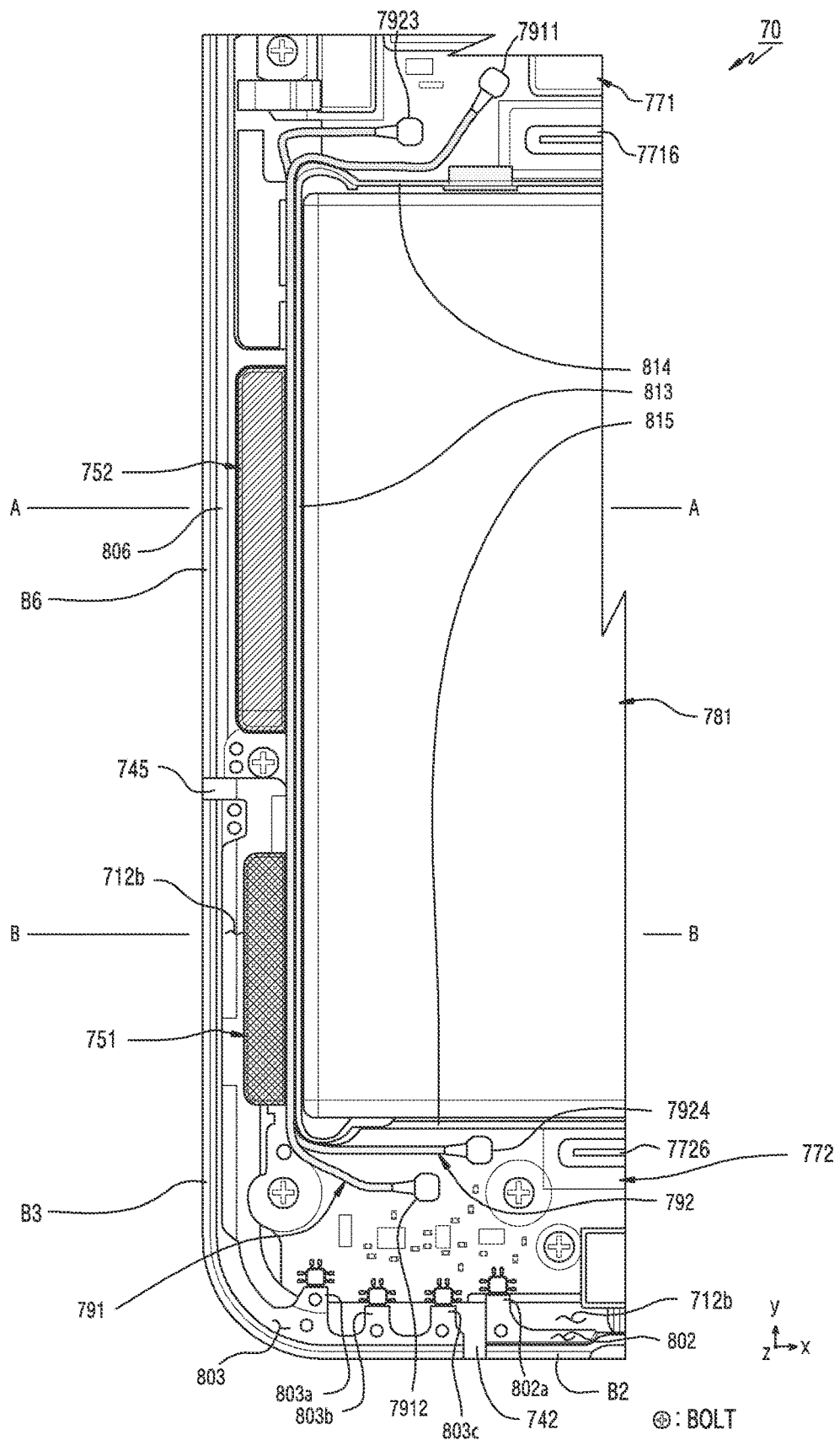
FIG. 8A illustrates a part of an electronic device according to an embodiment of the disclosure.

FIG. 8A illustrates a part of an electronic device according to an embodiment of the disclosure.

Figure 8B:
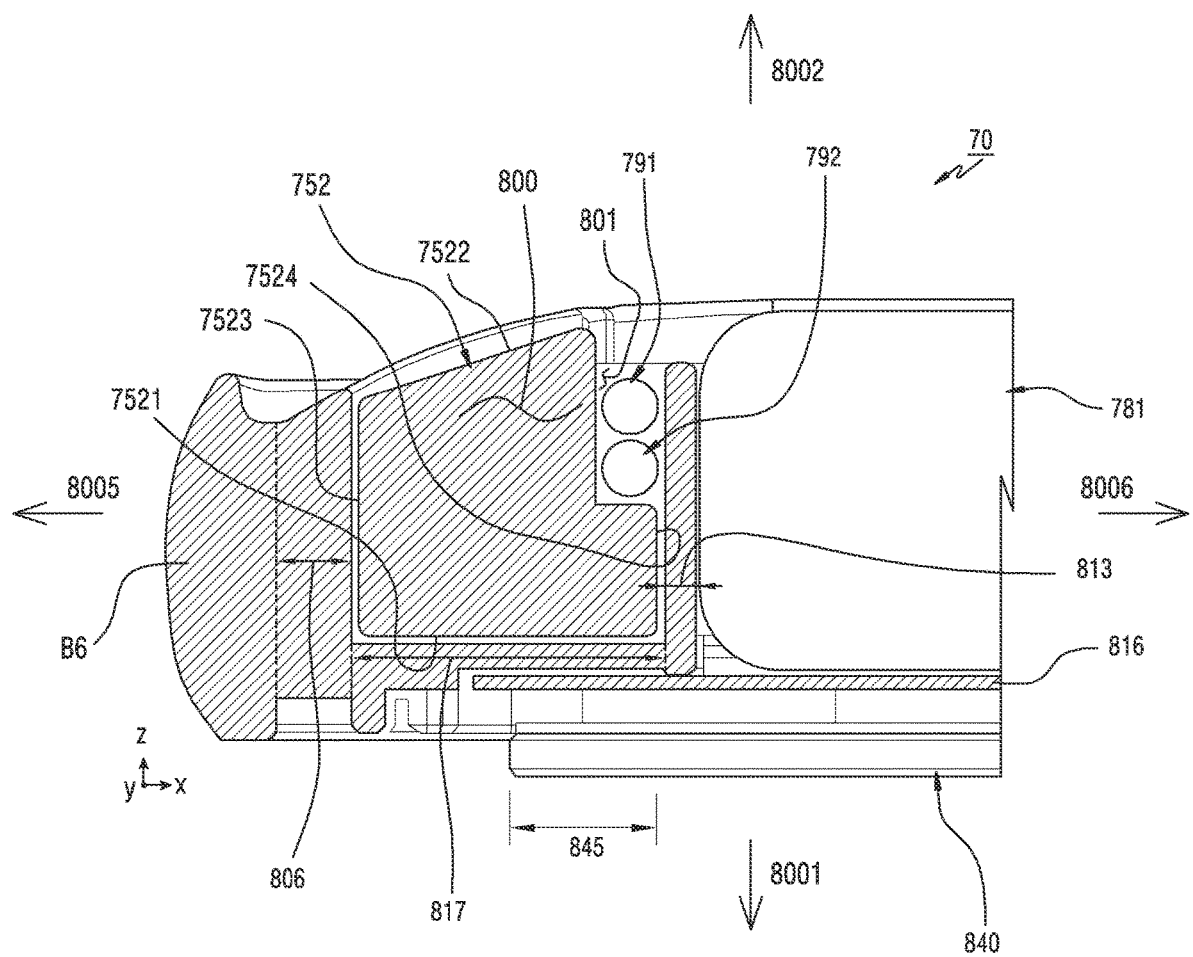
FIG. 8B is a sectional view taken along line A-A in an electronic device of FIG. 8A according to an embodiment of the disclosure.

FIG. 8B is a sectional view taken along line A-A in an electronic device of FIG. 8A according to an embodiment of the disclosure.

FIGS. 9A, 9B, 9C, 9D, and 9E are sectional views of various first magnets according to various embodiments of the disclosure.

Referring to FIGS. 8A and 8B, the electronic device 70 may include at least one of the second conductive part B2, the third conductive part B3, the sixth conductive part B6, the first inner conductive parts 802, 803, and 806, inner supports 813, 814, 815, 816, and 817, the first inner non-conductive part 712b, the first PCB 771, the second PCB 772, the first battery 781, or the plurality of first magnets 751 and 752.

Referring to FIG. 8A, when viewed above the second face (e.g., the second face 2002 of FIG. 2), the first inner conductive parts 802, 803, and 806 (e.g., the first inner conductive part 712a of FIG. 7) may include, for instance, the first inner conductive part 802 that is connected to the second conductive part B2, the first inner conductive part 803 that is connected to the third conductive part B3, or the first inner conductive part 806 that is connected to the sixth conductive part B6. When viewed above the second face (e.g., the second face 2002 of FIG. 2), the inner supports 813, 814, 815, and 816 may include the inner supports 813, 814, and 815 that at least partly surrounds the first battery 781, and the inner support 816 that is at least partly disposed between the first battery 781 and a display 840. Referring to FIG. 8B, the inner support 817 may face one face 7521 of the first magnet 752 directed in a first direction 8001 (e.g., the first direction 201 of FIG. 2).

According to various embodiments, at least some of the inner supports 813, 814, 815, 816, and 817 may be realized into the first inner non-conductive part 712b.

According to one embodiment, the first electrical path 791 may include a first terminal (or a first connector) 7911 for electrical connection with the first PCB 771, and a second terminal (or a second connector) 7912 for electrical connection with the second PCB 772. According to one embodiment, the second electrical path 792 may include a third terminal (or a third connector) 7923 for electrical connection with the first PCB 771, and a fourth terminal (or a fourth connector) 7924 for electrical connection with the second PCB 772. The first PCB 771 may include a connector (not illustrated) for electrical connection with the first terminal 7911, and a connector (not illustrated) for electrical connection with the third terminal 7923. The second PCB 772 may include a connector (not illustrated) for electrical connection with the second terminal 7912, and a connector (not illustrated) for electrical connection with the fourth terminal 7924.

According to any embodiment, the first terminal 7911 or the third terminal 7923 may be connected to the first PCB 771 by a conductive joint material such as solder. According to any embodiment, the second terminal 7912 or the fourth terminal 7924 may be connected to the second PCB 772 by a conductive joint material such as solder.

According to one embodiment, when viewed above the second face (e.g., the second face 2002 of FIG. 2), the first battery 781 may be disposed between the first terminal 7911 and the second terminal 7912, and/or between the third terminal 7923 and the fourth terminal 7924.

In one embodiment, referring to FIGS. 7 and 8A, the second terminal 7912 and/or the fourth terminal 7924 may be disposed closer to the second insulating part 742 than the first insulating part 741.

According to one embodiment, the first inner conductive part 802 connected to the second conductive part B2 may be electrically connected to the second PCB 772. For example, the first inner conductive part 802 may include a projected portion 802a to partly cover the second PCB 772. A conductive joint member (e.g., solder) or a flexible conductive member (e.g., a C clip (e.g., a C-shaped spring), a pogo-pin, a spring, a conductive Poron, a conductive rubber, a conductive tape, or a cooper connector) may be disposed between the projected portion 802a and the second PCB 772.

According to one embodiment, the second conductive part B2 may be electrically connected to a wireless communication circuit (e.g., the wireless communication module 192 of FIG. 1 or the wireless communication circuit 680 of FIG. 6), which is disposed on the first PCB 771, through the first electrical path 791 or the second electrical path 792, and be operated as an antenna radiator (e.g., the first antenna radiator ① of FIG. 6). According to various embodiments, the first inner conductive part 802 may also be operated as an antenna radiator along with the second conductive part B2. According to one embodiment, the projected portion 802a may become a feeding structure for the antenna radiator including the second conductive part B2. In one embodiment, referring to FIGS. 7 and 8A, the projected portion 802a utilized as the feeding structure may be disposed closer to the second insulating part 742 than the first insulating part 741.

In one embodiment, referring to FIGS. 7 and 8A, the second terminal 7912 and/or the fourth terminal 7924 may be disposed to be separated from the projected portion 802a utilized as the feeding structure below a set distance (e.g., about 30 mm). Thereby, antenna radiation performance of an antenna system (e.g., the first antenna system 6801 of FIG. 6) utilizing the second conductive part B2 can be secured.

According to one embodiment, the first inner conductive part 803 connected to the third conductive part B3 may be electrically connected to the second PCB 772. For example, the first inner conductive part 803 may include projected portions 803a, 803b, and 803c to partly cover the second PCB 772. A conductive joint member (e.g., solder) or a flexible conductive member (e.g., a C clip, a pogo-pin, a spring, a conductive Poron, a conductive rubber, a conductive tape, or a cooper connector) may be disposed between the projected portions 803a, 803b, and 803c and the second PCB 772). According to one embodiment, the third conductive part B3 may be electrically connected to the wireless communication circuit (e.g., the wireless communication module 192 of FIG. 1 or the wireless communication circuit 680 of FIG. 6), which is disposed on the first PCB 771, through the first electrical path 791 or the second electrical path 792, and be operated as an antenna radiator (e.g., the second antenna radiator ② of FIG. 6). According to various embodiments, the first inner conductive part 803 may also be operated as an antenna radiator along with the third conductive part B3. According to one embodiment, at least one of the projected portions 803a, 803b, and 803c may become a feeding structure for the antenna radiator including the third conductive part B3. According to various embodiments, some of the projected portions 803a, 803b, and 803c may become a ground part that is electrically connected to the ground of the second PCB 772.

In one embodiment, referring to FIGS. 7 and 8A, the projected portion 803a, 803b, or 803c utilized as the feeding structure may be disposed closer to the second insulating part 742 than the fifth insulating part 745.

In one embodiment, referring to FIGS. 7 and 8A, the second terminal 7912 and/or the fourth terminal 7924 may be disposed to be separated from the projected portion 803a, 803b, or 803c utilized as the feeding structure below a set distance (e.g., about 30 mm). Thereby, antenna radiation performance of an antenna system (e.g., the second antenna system 6802 of FIG. 6) utilizing the third conductive part B3 can be secured.

In one embodiment, referring to FIGS. 7 and 8A, the second terminal 7912 and/or the fourth terminal 7924 may be disposed closer to the second insulating part 742 than the first insulating part 741 and the fifth insulating part 745. Thereby, the antenna radiation performance of the an antenna system (e.g., the first antenna system 6801 of FIG. 6) utilizing the second conductive part B2, and/or the antenna system (e.g., the second antenna system 6802 of FIG. 6) utilizing the third conductive part B3 can be secured.

According to one embodiment, when the second terminal 7912 and/or the fourth terminal 7924 are disposed closer to the second insulating part 742 than the first insulating part 741 and the fifth insulating part 745, the first electrical path 791 and/or the second electrical path 792 may be disposed in the first space (e.g., the first space 512 of FIG. 5A) formed around the third lateral face 731 along with the plurality of first magnets 751 and 752. This disposition structure can make the electronic device 70 slim while securing the antenna radiation performance of the antenna system (e.g., the first antenna system 6801 of FIG. 6) utilizing the second conductive part B2, and/or the antenna system (e.g., the second antenna system 6802 of FIG. 6) utilizing the third conductive part B3.

Referring to FIG. 8B, the first magnet 752 may be disposed in a first space 800 (e.g., the first space 512 of FIG. 5A) that is formed by the sixth conductive part B6, the inner conductive parts 806, and the inner supports 813 and 817. According to one embodiment, the first magnet 752 may include a front face 7521 (e.g., the one face 551 of FIG. 5B) that is substantially directed in a first direction 8001 (e.g., the first direction 201 of FIG. 2 or the first direction 501 of FIG. 5A), a rear face 7522 that is disposed on a side opposite to the front face 7521, a first lateral face 7523 that faces the sixth conductive part B6, and a second lateral face 7524 that faces the first battery 781. According to one embodiment, the inner conductive part 806 may be disposed between the sixth conductive part B6 and the first lateral face 7523 of the first magnet 752. The inner support 813 may be disposed between the first battery 781 and the second lateral face 7524 of the first magnet 752. The inner support 817 may be disposed to face the front face 7521 of the first magnet 752.

According to one embodiment, the inner support 817 may be formed of a non-conductive material so as not to shield a magnetic force from the first magnet 751.

According to various embodiments, to secure antenna radiation performance of an antenna system (e.g., the fourth antenna system 6804 of FIG. 6) utilizing the sixth conductive part B6, the inner conductive part 806 may be replaced by a non-conductive material, and be realized into, for instance, the first inner non-conductive part 712b.

According to various embodiments, referring to FIG. 8B, a non-magnetized material may be disposed in at least a partial region of the first magnet 752 such that a magnetic field generated by the first magnet 752 does not substantially distribute a magnetic force in a second direction 8002 and/or a fifth or sixth direction 8005 or 8006 orthogonal to the second direction 8002. According to one embodiment, the non-magnetized material may be disposed in at least a partial region of the first magnet 752 such that the magnetic field generated by the first magnet 752 substantially distributes the magnetic force in the first direction 8001. For example, the non-magnetized material may include an amorphous metal such as an amorphous ribbon, polycarbonate, or epoxy.

According to various embodiments, the inner conductive part 806 and/or the sixth conductive part B6 may include a layer formed of a non-magnetized material (e.g., an amorphous metal such as an amorphous ribbon, polycarbonate, or epoxy) that is at least partly disposed between the first magnet 752 and the sixth conductive part B6 so as not to be magnetized by the first magnet 752. For example, the layer may be formed in the shape of a sheet that can be attached to the first magnet 752, or may be formed by coating.

According to various embodiments, a face (not illustrated) of the first magnet 752 by which a recess 801 is formed may be coated with a non-magnetized material, and thereby an influence which the magnetic field generated by the first magnet 752 produces on the first electrical path 791 and the second electrical path 792 can be reduced.

According to various embodiments, the first magnet 751, 752, or 753 may be a shield magnet. The shield magnet may be a metal magnetic substance that imparts directivity to the lines of magnetic force formed between N and S poles of the magnet. The shield magnet enables a magnetic force to be distributed in the first direction 8001 that is substantially directed to a second face (e.g., the second face 2002 of FIG. 2). According to one embodiment, the shield magnet may include a shield structure that includes a magnet and a ferromagnetic substance (e.g., iron) joined to a partial region of the magnet.

According to one embodiment, when viewed above the display 840, a part 845 of the display 840 may be disposed to overlap a part of the front face 7521 of the first magnet 752. According to various embodiments, when viewed above the display 840, at least a part of the front face 7521 of the first magnet 752 may be disposed to overlap the display 840.

According to one embodiment, the first magnet 752 disposed in the first space 800 may include the recess 801 (e.g., the recess 553 of FIG. 5A) for disposing the first electrical path 791 and the second electrical path 792. For example, the recess 801 may have a shape in which a corner portion at which the rear face 7522 and the second lateral face 7524 of the first magnet 752 meet is removed. A structure in which the first electrical path 791 and the second electrical path 792 are disposed in the recess 801 can increase spatial efficiency to dispose the first electrical path 791 and the second electrical path 792 in a confined internal space of the electronic device 70 along with the first magnet 752.

According to various embodiments, a cross-sectional structure of the first magnet 751 taken along another line B-B in the electronic device 70 of FIG. 8A may be equivalent to when at least a part of the first inner conductive part 806 connected to the sixth conductive part B6 in FIG. 8B is replaced by the first inner non-conductive part 712b.

Figure 9A:
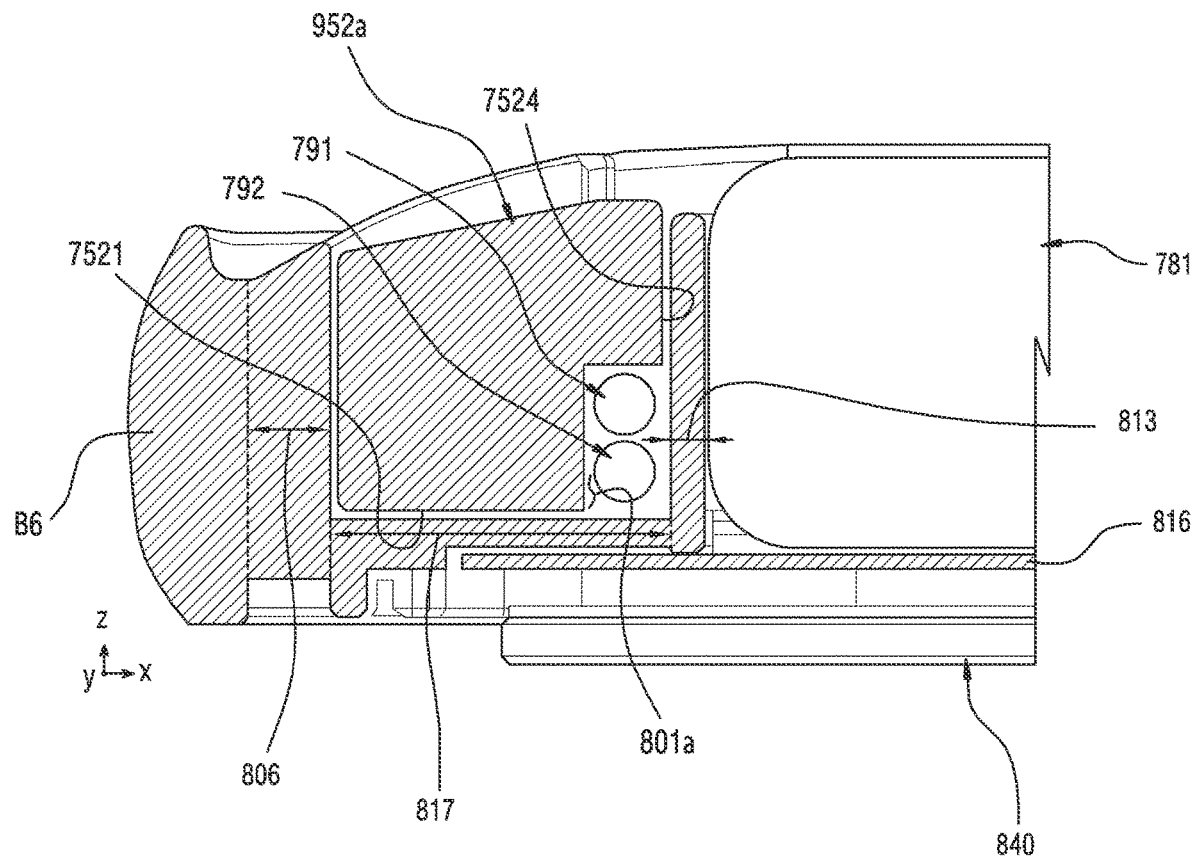
FIG. 9A is a sectional view of various first magnets according to an embodiment of the disclosure.

In various embodiments, referring to FIG. 9A, a first magnet 952a disposed in the first space 800 may have a shape in which a corner portion at which the front face 7521 and the second lateral face 7524 of the first magnet 952a meet is removed.

Figure 9B:
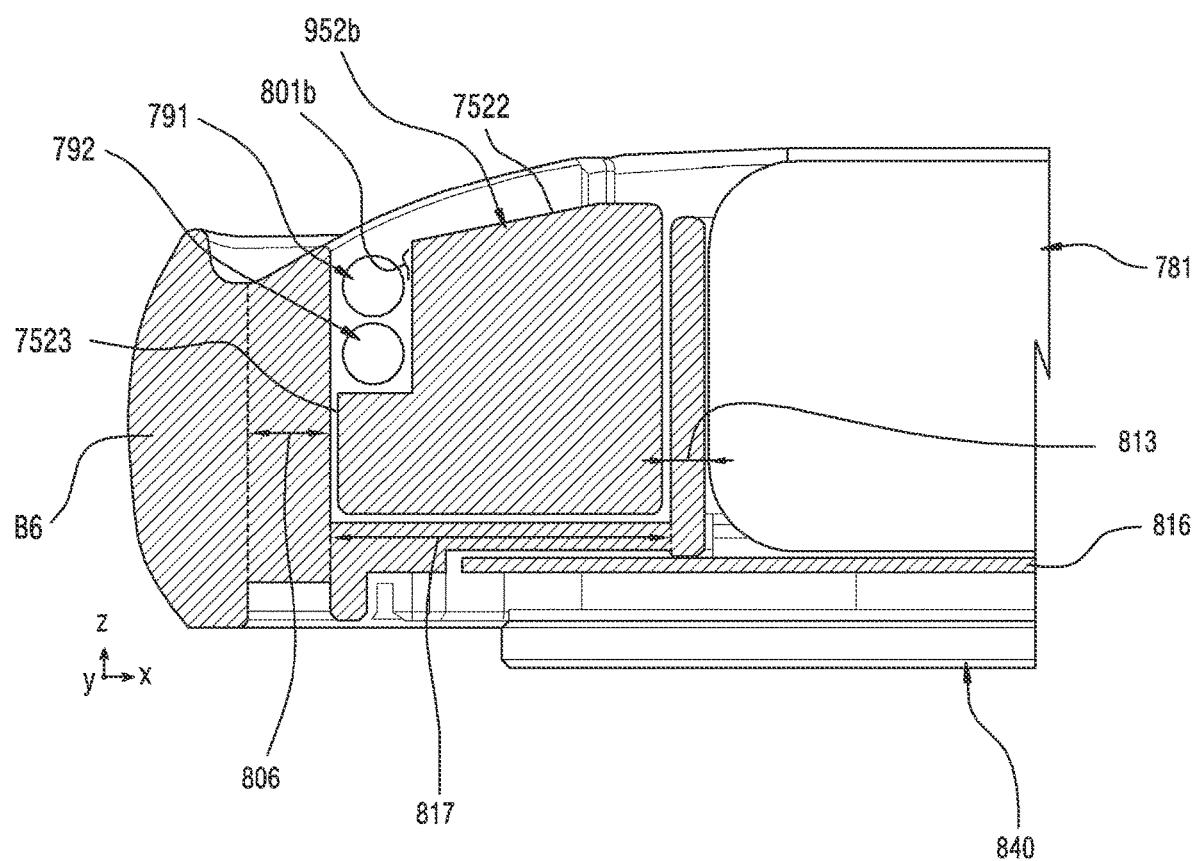
FIG. 9B is a sectional view of various first magnets according to an embodiment of the disclosure.

In various embodiments, referring to FIG. 9B, a first magnet 952b disposed in the first space 800 may have a shape in which a corner portion at which the rear face 7522 and the first lateral face 7523 of the first magnet 952b meet is removed.

Figure 9C:
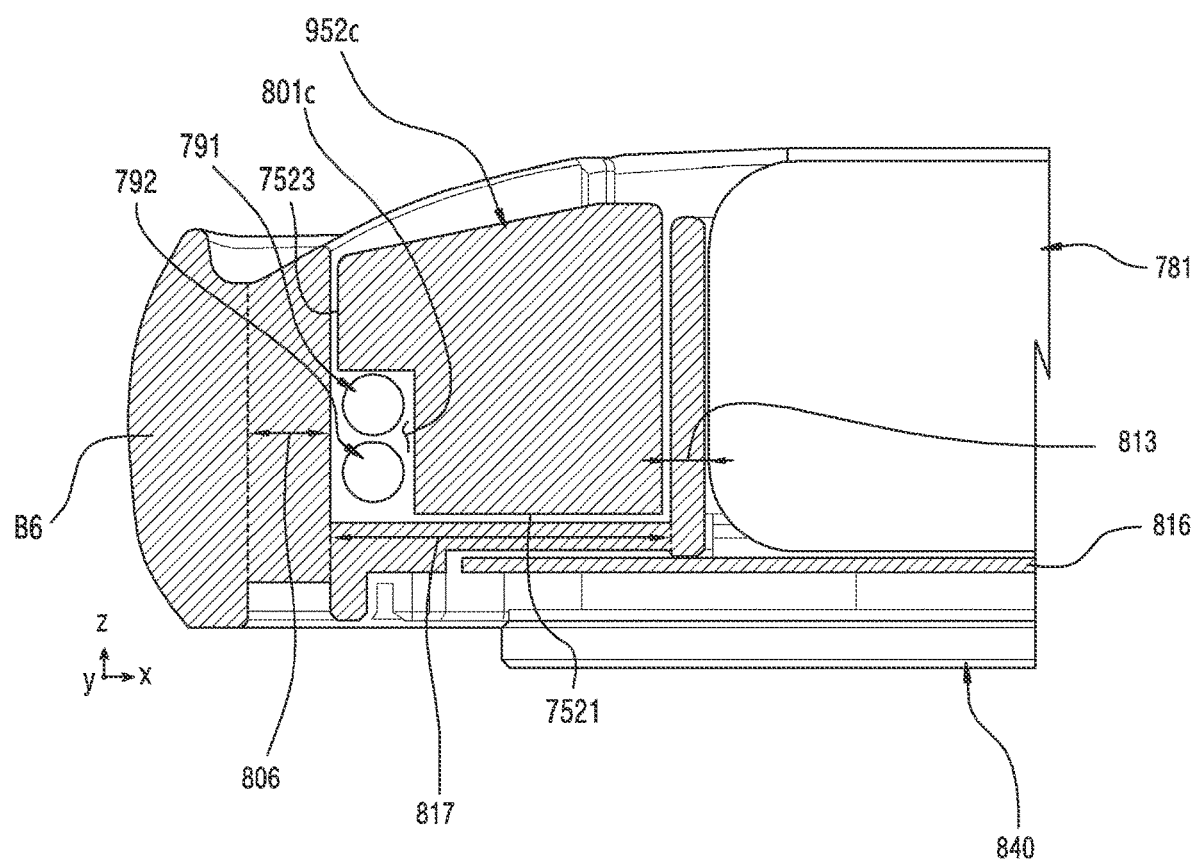
FIG. 9C is a sectional view of various first magnets according to an embodiment of the disclosure.

In various embodiments, referring to FIG. 9C, a first magnet 952c disposed in the first space 800 may have a shape in which a corner portion at which the front face 7521 and the first lateral face 7523 of the first magnet 952c meet is removed.

Figure 9D:
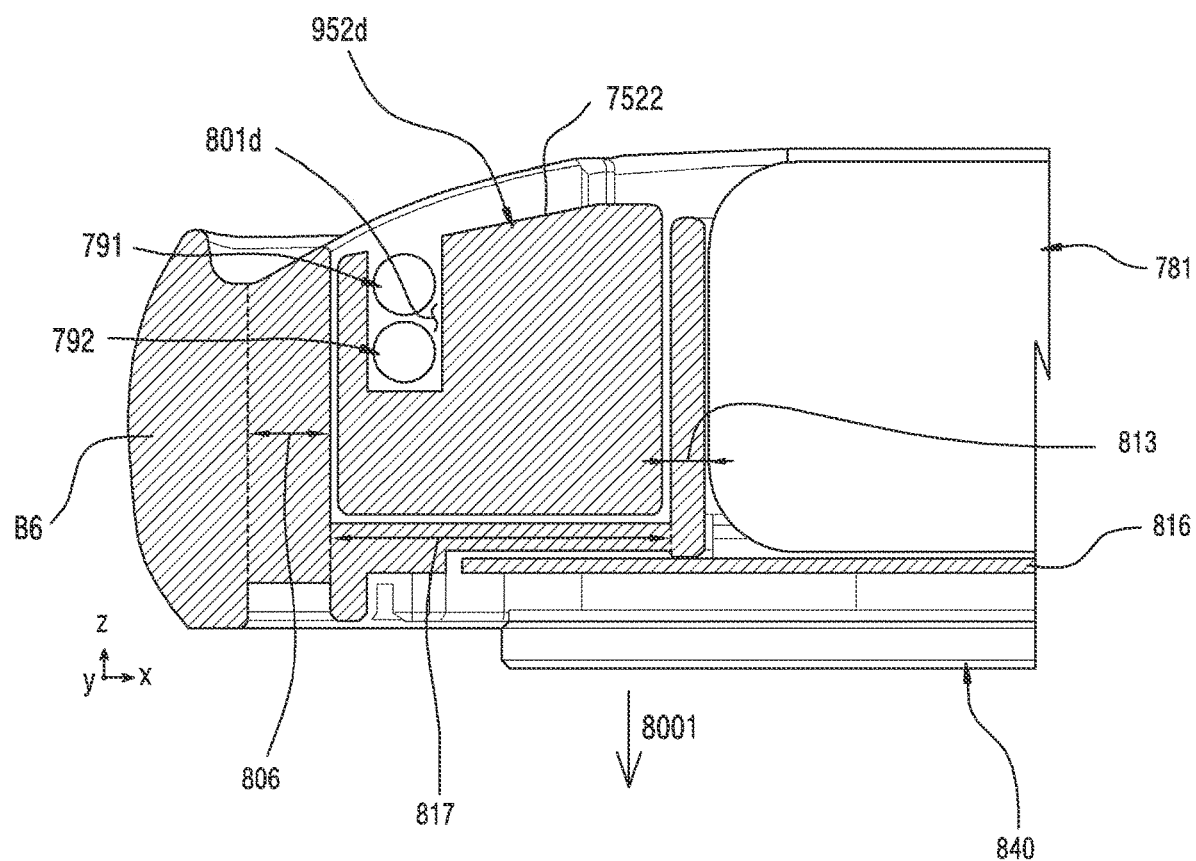
FIG. 9D is a sectional view of various first magnets according to an embodiment of the disclosure.

In various embodiments, referring to FIG. 9D, a first magnet 952d disposed in the first space 800 may be realized to have a recess 801c dented in the rear face 7522 in the first direction 8001.

Figure 9E:
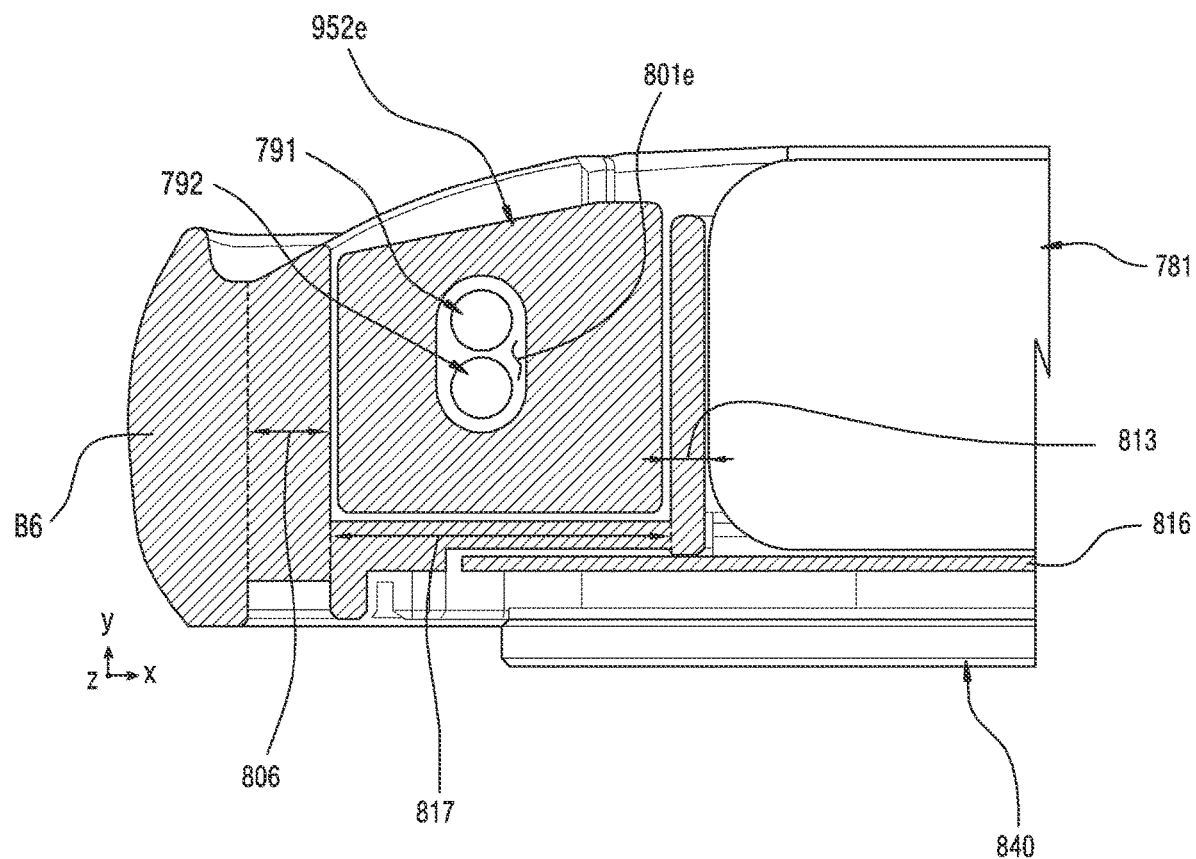
FIG. 9E is a sectional view of various first magnets according to an embodiment of the disclosure.

In various embodiments, referring to FIG. 9E, a first magnet 952e disposed in the first space 800 may be realized to have a through-hole 801e for disposing the first electrical path 791 and the second electrical path 792.

Figure 10A:
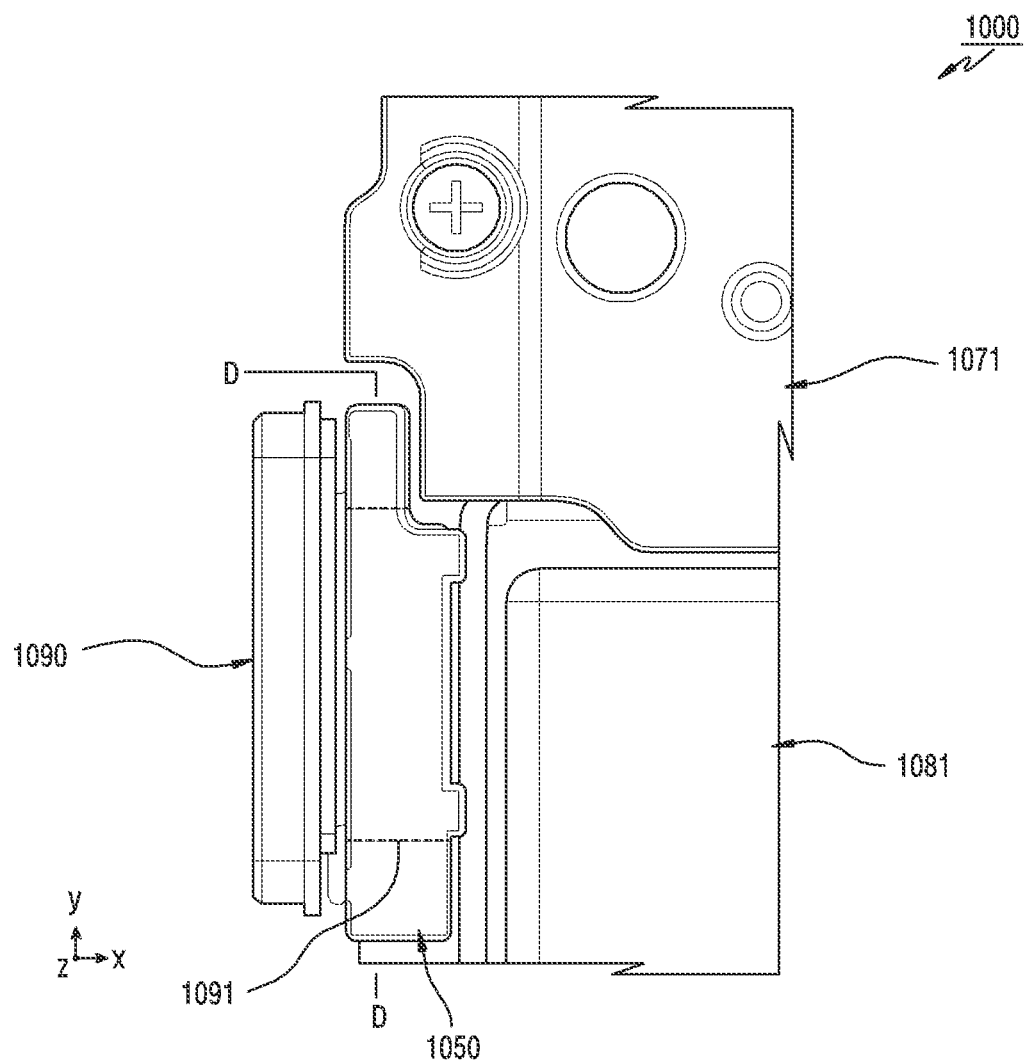
FIG. 10A illustrates an electronic device according to an embodiment of the disclosure.

FIG. 10A illustrates an electronic device according to an embodiment of the disclosure.

Figure 10B:
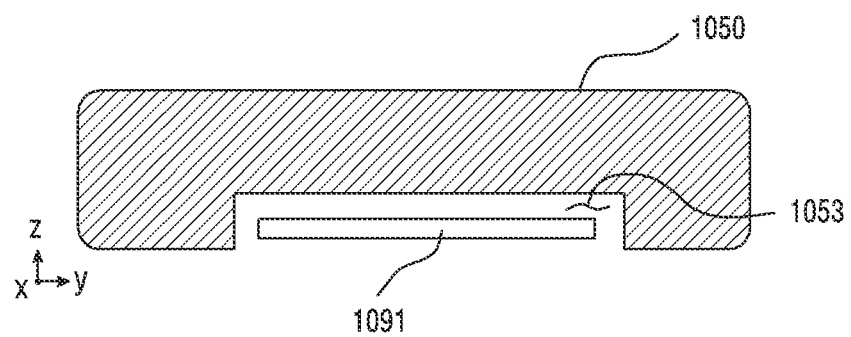
FIG. 10B is a sectional view taken along line D-D of a first magnet and an electrical path of an electronic device of FIG. 10A according to an embodiment of the disclosure.

FIG. 10B is a sectional view taken along line D-D of a first magnet and an electrical path of an electronic device of FIG. 10A according to an embodiment of the disclosure.

Referring to FIG. 10A, in one embodiment, an electronic device 1000 (e.g., the electronic device 20 of FIG. 2, the electronic device 50 of FIG. 5A, or the electronic device 70 of FIG. 7) may include a first PCB 1071 (e.g., the first PCB 771 of FIG. 7), a first battery 1081 (e.g., the first battery 781 of FIG. 7), a first magnet 1050 (e.g., the first magnet 751 of FIG. 7), or a key input device 1090 (e.g., the key input device 7715 of FIG. 7).

According to one embodiment, when viewed above the second face (e.g., the second face 2002 of FIG. 2), an electrical path 1091 such as a FPCB that is electrically connected between the key input device 1090 and the first PCB 1071 may overlap the first magnet 1050.

Referring to FIG. 10B, the first magnet 1050 may include a recess 1053 that can house the electrical path 1091. A structure in which the electrical path 1091 is disposed in the recess 1053 can increase spatial efficiency to dispose the electrical path 1091 in a confined internal space of the electronic device 1000 along with the first magnet 1050.

According to one embodiment of the disclosure, an electronic device (e.g., an electronic device 50 of FIG. 5A) may include a foldable housing (e.g., a foldable housing 500 of FIG. 5A). The foldable housing may include a hinge structure (e.g., a hinge structure 530 of FIG. 5A). The foldable housing may include a first housing structure (e.g., a first housing structure 510 of FIG. 5A) that has a first face (e.g., a first face 5001 of FIG. 5A) that is connected to the hinge structure and is directed in a first direction (e.g., a first direction 501 of FIG. 5A), a second face (e.g., a second face 5002 of FIG. 5A) that is directed in a second direction (e.g., a second direction 502 of FIG. 5A) opposite to the first direction, and a first lateral member (e.g., a first lateral member 610 of FIG. 6) that at least partly surrounds a space between the first face and the second face. The foldable housing may include a second housing structure (e.g., a second housing structure 520 of FIG. 5A) that has a third face (e.g., a third face 5003 of FIG. 5A) that is connected to the hinge structure and is directed in a third direction (e.g., a third direction 503 of FIG. 5A), a fourth face (e.g., a fourth face 5004 of FIG. 5A) that is directed in a fourth direction (e.g., a fourth direction 504 of FIG. 5A) opposite to the third direction, and a second lateral member (e.g., a second lateral member 620 of FIG. 6) that at least partly surrounds a space between the third face and the fourth face, and that is folded about the hinge structure onto the first housing structure. The first lateral member may provide a first lateral face (e.g., a first lateral face 611 of FIG. 6) and a second lateral face (e.g., a second lateral face 621 of FIG. 6) that are directed opposite to each other, and a third lateral face (e.g., a third lateral face 631 of FIG. 6) that is orthogonal to the first lateral face and is disposed apart from the hinge structure. The second lateral member may provide a fourth lateral face (e.g., a fourth lateral face 612 of FIG. 6) that is directed in the same direction as the first lateral face, a fifth lateral face (e.g., a fifth lateral face 622 of FIG. 6) that is directed in the same direction as the second lateral face, and a sixth lateral face (e.g., a sixth lateral face 632 of FIG. 6) that is directed in the same direction as the third lateral face in the folded state. The first face may face the third face in the folded state, and the third direction may be the same as the first direction in an unfolded state. The electronic device may include a flexible display (e.g., a display 540 of FIG. 5A) that extends from the first face to the third face. The electronic device may include a first magnet (e.g., a first magnet 550 of FIG. 5A) that is disposed around the third lateral face in the first housing structure. The electronic device may include a second magnet (e.g., a second magnet 560 of FIG. 5A) whose polarities are different from those of the first magnet and which is disposed around the sixth lateral face in the second housing structure so as to face the first magnet in the folded state. The electronic device may include at least one electrical path (e.g., an electrical path 590 of FIG. 5A or first and second electrical paths 791 and 792 of FIG. 8B) that is disposed in a recess (e.g., a recess 553 of FIG. 5A or a recess 801 of FIG. 8B) formed in the first magnet.

According to one embodiment of the disclosure, the electronic device may further include a first battery (e.g., a first battery 781 of FIG. 7) that is disposed between the first face and the second face. When viewed above the second face, the first magnet (e.g., the first magnet 751, 752, or 753 of FIG. 7) may be disposed between the third lateral face and the first battery.

According to one embodiment of the disclosure, the electronic device may further include a first PCB (e.g., a first PCB 771 of FIG. 7) that is disposed between the first face and the second face and is disposed closer to the first lateral face than the second lateral face, and a second PCB (e.g., a second PCB 772 of FIG. 7) that is disposed closer to the second lateral face than the first lateral face. When viewed above the second face, the first battery may be disposed between the first PCB and the second PCB. The at least one electrical path (e.g., the first electrical path 791 and the second electrical path 792 of FIG. 7) may electrically connect the first PCB and the second PCB.

According to one embodiment of the disclosure, the electronic device may further include a second battery (e.g., a second battery 782 of FIG. 7) that is disposed between the third face and the fourth face. When viewed above the second face, the second magnet may be disposed between the sixth lateral face and the second battery.

According to one embodiment of the disclosure, the electronic device may further include a third PCB (e.g., a third PCB 773 of FIG. 7) that is disposed between the third face and the fourth face and is disposed closer to the fourth lateral face than the fifth lateral face, and a fourth PCB (e.g., a fourth PCB 774 of FIG. 7) that is disposed closer to the fifth lateral face than the fourth lateral face. When viewed above the fourth face, the second battery may be disposed between the third PCB and the fourth PCB.

According to one embodiment of the disclosure, the first lateral member may include a first conductive part (e.g., a first conductive part A1 of FIG. 6) and a second conductive part (e.g., a second conductive part A2 of FIG. 6) that form a part of the second lateral face, a third conductive part (e.g., a third conductive part A3 of FIG. 6) that forms a part of the second lateral face and a part of the third lateral face, a fourth conductive part (e.g., a fourth conductive part A4 of FIG. 6) and a fifth conductive part (e.g., a fifth conductive part A5 of FIG. 6) that form a part of the first lateral face, a sixth conductive part (e.g., a sixth conductive part A6 of FIG. 6) that forms a part of the first lateral face and a part of the third lateral face, a first insulating part (e.g., a first insulating part 641 of FIG. 6) between the first conductive part and the second conductive part, a second insulating part (e.g., a second insulating part 642 of FIG. 6) between the second conductive part and the third conductive part, a third insulating part (e.g., a third insulating part 643 of FIG. 6) between the fourth conductive part and the fifth conductive part, a fourth insulating part (e.g., a fourth insulating part 644 of FIG. 6) between the fifth conductive part and the sixth conductive part, and a fifth insulating part (e.g., a fifth insulating part 645 of FIG. 6) between the third conductive part and the sixth conductive part.

According to one embodiment of the disclosure, the second lateral member may include a seventh conductive part (e.g., a seventh conductive part A7 of FIG. 6) and an eighth conductive part (e.g., an eighth conductive part A8 of FIG. 6) that form a part of the fifth lateral face, a ninth conductive part (e.g., a ninth conductive part A9 of FIG. 6) that forms a part of the fifth lateral face and a part of the sixth lateral face, a tenth conductive part (e.g., a tenth conductive part A10 of FIG. 6) and an eleventh conductive part (e.g., an eleventh conductive part A11 of FIG. 6) that form a part of the fourth lateral face, a twelfth conductive part (e.g., a twelfth conductive part A12 of FIG. 6) that forms a part of the fourth lateral face and a part of the sixth lateral face, a sixth insulating part (e.g., a sixth insulating part 646 of FIG. 6) between the seventh conductive part and the eighth conductive part, a seventh insulating part (e.g., a seventh insulating part 647 of FIG. 6) between the eighth conductive part and the ninth conductive part, an eighth insulating part (e.g., an eighth insulating part 648 of FIG. 6) between the tenth conductive part and the eleventh conductive part, a ninth insulating part (e.g., a ninth insulating part 649 of FIG. 6) between the eleventh conductive part and the twelfth conductive part, and a tenth insulating part (e.g., a tenth insulating part 650 of FIG. 6) between the ninth conductive part and the twelfth conductive part. The first insulating part and the sixth insulating part, the second insulating part and the seventh insulating part, the third insulating part and the eighth insulating part, the fourth insulating part and the ninth insulating part, and the fifth insulating part and the tenth insulating part may be substantially aligned in the folded state.

According to one embodiment of the disclosure, the electronic device may further include a first PCB (e.g., a first PCB 771 of FIG. 7) that is disposed between the first face and the second face and is disposed closer to the first lateral face than the second lateral face, and a second PCB (e.g., a second PCB 772 of FIG. 7) that is disposed closer to the second lateral face than the first lateral face. The at least one electrical path (e.g., the first electrical path 791 and the second electrical path 792 of FIG. 7) may electrically connect the first PCB and the second PCB.

According to one embodiment of the disclosure, the at least one electrical path may include a first terminal (e.g., a first terminal 7911 of FIG. 8A) that is electrically connected to the first PCB, and a second terminal (e.g., a second terminal 7912 of FIG. 8A) that is electrically connected to the second PCB. When viewed above the second face, the second terminal may be disposed closer to the third lateral face (e.g., the third lateral face 731 of FIG. 7) than the hinge structure.

According to one embodiment of the disclosure, the electronic device may further include at least one wireless communication circuit (e.g., a wireless communication circuit 680 of FIG. 6) that is disposed on the first PCB (e.g., the first PCB 771 of FIG. 7), is electrically connected to the second conductive part (e.g., the second conductive part B2 of FIG. 7) through the at least one electrical path, and is configured to transmit and/or receive signals of a first frequency band.

According to one embodiment of the disclosure, the second PCB (e.g., the second PCB 772 of FIG. 8A) may be electrically connected to a first position (e.g., a projected portion 802*a* of FIG. 8B) on the second conductive part that is closer to the second insulating part (e.g., the second insulating part 742 of FIG. 7) than the first insulating part (e.g., the first insulating part 741 of FIG. 7).

According to one embodiment of the disclosure, the at least one wireless communication circuit may be electrically connected to the third conductive part (e.g., the third conductive part B3 of FIG. 8A) through the at least one electrical path (e.g., a first electrical path 791 and a second electrical path 792 of FIG. 8A), and be configured to transmit and/or receive signals of a second frequency band.

According to one embodiment of the disclosure, the second PCB (e.g., the second PCB 772 of FIG. 8A) may be electrically connected to a second position (e.g., projected portion 803*a*, 803*b*, or 803*c*) on the third conductive part that is close to the second insulating part (e.g., the second insulating part 742 of FIG. 8A).

According to one embodiment of the disclosure, the first magnet may be disposed around a part of the third conductive part (e.g., the third conductive part B3 of FIG. 7) that forms the third lateral face.

According to one embodiment of the disclosure, the first magnet may be disposed around a part of the sixth conductive part (e.g., the sixth conductive part B6 of FIG. 7) that forms the third lateral face.

According to one embodiment of the disclosure, when viewed above the second face, the first magnet may at least partly overlap the display.

According to one embodiment of the disclosure, when viewed above the fourth face, the second magnet may at least partly overlap the display.

According to one embodiment of the disclosure, one face (e.g., one face 551 of FIG. 5B) of the first magnet directed in the first direction may be different in shape from one face (e.g., one face 561 of FIG. 5B) of the second magnet directed in the third direction.

According to one embodiment of the disclosure, the at least one electrical path may include a coaxial cable.

According to one embodiment of the disclosure, the at least one electrical path may include a flexible printed circuit board (FPCB) (e.g., an electrical path 1091 of FIG. 10A) that is electrically connected to a key input device (e.g., a key input device 1090 of FIG. 10A).

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
    a housing foldable with respect to a folding axis and including a first housing portion and a second housing portion, the first housing portion including a first sidewall substantially parallel with the folding axis, a second sidewall extended from a first end of the first sidewall and substantially perpendicular to the folding axis, and a third sidewall extended from a second end of the first sidewall and substantially perpendicular to the folding axis;
    a hinge structure accommodated in the housing and coupled with the first housing portion and the second housing portion;
    a flexible display including a first display portion accommodated in the first housing portion and a second display portion accommodated in the second housing portion;
    a plurality of magnets including a first magnet accommodated in the first housing portion and disposed along a portion of the first sidewall, and a second magnet accommodated in the second housing portion and disposed to face the first magnet when the housing is fully folded;
    a battery accommodated in the first housing portion such that at least a portion of the battery is disposed between the hinge structure and the first magnet;
    a first printed circuit board (PCB) accommodated in the first housing portion and disposed between the battery and the second sidewall;
    a second PCB, accommodated in the first housing portion, disposed between the battery and the third sidewall, and separately disposed from the first PCB; and
    a first cable disposed at least partially in an area within a space formed between the first sidewall and the battery, wherein the first cable connects the first PCB with the second PCB.

2. The portable communication device of claim 1, wherein a substantial portion of the first cable is disposed along with the first sidewall and the battery to connect with the second PCB.

3. The portable communication device of claim 1, further comprising a microphone or a speaker disposed on the second PCB.

4. The portable communication device of claim 1, wherein the plurality of magnets includes a third magnet disposed along another portion of the first sidewall as spaced apart from the first magnet, and a fourth magnet accommodated in the second housing portion to face the third magnet when the housing is fully folded.

5. The portable communication device of claim 1, further comprising:
    a second cable stacked at least partially with the first cable and connecting the first PCB with another part of the second PCB.

6. The portable communication device of claim 5, wherein the first cable and the second cable are stacked with each other in an area between the first magnet and the battery.

7. The portable communication device of claim 5, wherein the other part of the second PCB is located in an area between the third sidewall and the battery.

8. The portable communication device of claim 1,
   wherein the first PCB includes a wireless communication circuit disposed thereon, and
   wherein at least one of the first sidewall, the second sidewall or the third sidewall includes two non-conductive portions and a conductive portion located therebetween and configured to operate as an antenna for the wireless communication circuit.

9. The portable communication device of claim 8, wherein the first cable is electrically connected with the conductive portion and the first PCB such that the first cable is to operate as a transmission line for the antenna.

10. The portable communication device of claim 1, wherein the magnet is formed with a recess or a through-hole oriented parallel to the first sidewall through which the first cable is disposed.

\* \* \* \* \*